(12) United States Patent
Shiokawa et al.

(10) Patent No.: US 11,871,557 B2
(45) Date of Patent: Jan. 9, 2024

(54) SEMICONDUCTOR DEVICE AND SEMICONDUCTOR MEMORY DEVICE

(71) Applicant: Kioxia Corporation, Tokyo (JP)

(72) Inventors: Taro Shiokawa, Nagoya Aichi (JP);
Kiwamu Sakuma, Yokkaichi Mie (JP);
Keiko Sakuma, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 136 days.

(21) Appl. No.: 17/690,425

(22) Filed: Mar. 9, 2022

(65) Prior Publication Data

US 2023/0088455 A1    Mar. 23, 2023

(30) Foreign Application Priority Data

Sep. 21, 2021   (JP) ................................ 2021-153487

(51) Int. Cl.
*H01L 27/108* (2006.01)
*H10B 12/00* (2023.01)
*H01L 29/786* (2006.01)

(52) U.S. Cl.
CPC ......... *H10B 12/30* (2023.02); *H01L 29/7869* (2013.01); *H01L 29/78642* (2013.01)

(58) Field of Classification Search
CPC ........ H10B 12/30; H10B 12/05; H10B 12/33; H01L 29/78642; H01L 29/7869
See application file for complete search history.

(56) References Cited

U.S. PATENT DOCUMENTS

| | | |
|---|---|---|
| 10,043,864 B2 | 8/2018 | Oda et al. |
| 10,714,629 B2 | 7/2020 | Saito et al. |
| 10,790,396 B2 | 9/2020 | Sawabe et al. |
| 2016/0225774 A1 | 8/2016 | Ohmaru et al. |
| 2017/0040416 A1 | 2/2017 | Ota et al. |
| 2019/0229017 A1* | 7/2019 | Liu ..................... H01L 27/1248 |
| 2019/0355799 A1* | 11/2019 | Jeong ................. H10K 59/1213 |

* cited by examiner

*Primary Examiner* — Mohammed R Alam
(74) *Attorney, Agent, or Firm* — Foley & Lardner LLP

(57) ABSTRACT

A semiconductor device according to the embodiment includes: a first electrode; a second electrode; an oxide semiconductor layer provided between the first electrode and the second electrode; a gate electrode opposed to the oxide semiconductor layer; a gate insulating layer provided between the oxide semiconductor layer and the gate electrode; a first insulating layer provided between the gate electrode and the first electrode; and a second insulating layer provided between the gate electrode and the second electrode and having an oxygen atom concentration lower than an oxygen atom concentration of the first insulating layer.

15 Claims, 17 Drawing Sheets

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2021-153487, filed on Sep. 21, 2021, the entire contents of which are incorporated herein by reference.

FIELD

Embodiments described herein relate generally to a semiconductor device and a semiconductor memory device.

BACKGROUND

An oxide semiconductor transistor, in which a channel is formed in an oxide semiconductor layer, has an excellent characteristic that a channel leakage current during an off operation is extremely small. Therefore, for example, applying the oxide semiconductor transistor to a switching transistor of a memory cell of a dynamic random access memory (DRAM) has been studied.

For example, a characteristic of the oxide semiconductor transistor may be changed due to heat treatment performed after a transistor structure is formed. Therefore, it is expected to realize an oxide semiconductor transistor having a small characteristic change and a stable characteristic even after the heat treatment.

DETAILED DESCRIPTION

Figure 1:
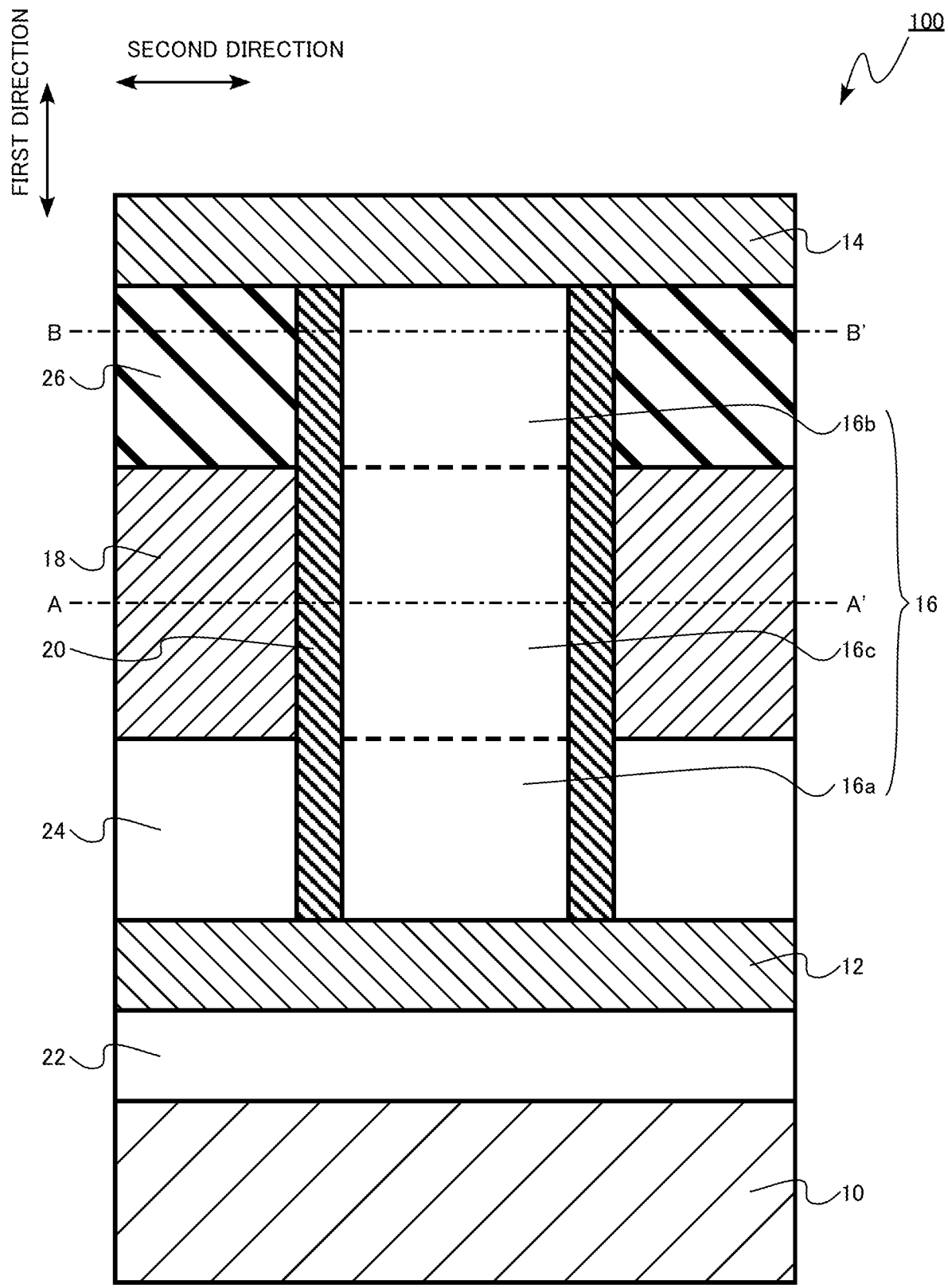
FIG. 1 is a schematic cross-sectional view of a semiconductor device according to a first embodiment.

A semiconductor device according to the embodiment includes: a first electrode; a first electrode; a second electrode; an oxide semiconductor layer provided between the first electrode and the second electrode; a gate electrode opposed to the oxide semiconductor layer; a gate insulating layer provided between the oxide semiconductor layer and the gate electrode; a first insulating layer provided between the gate electrode and the first electrode; and a second insulating layer provided between the gate electrode and the second electrode, and the second insulating layer having an oxygen atom concentration lower than an oxygen atom concentration of the first insulating layer.

Hereinafter, embodiments of the present disclosure will be described with reference to the drawings. In the following description, the same or similar members may be denoted by the same reference numerals, and the description of the members described once may be appropriately omitted.

In the present specification, the term "upper" or "lower" may be used for convenience. The "upper" or the "lower" is merely a term indicating a relative positional relationship in the drawings, and is not a term defining a positional relationship with respect to gravity.

Qualitative analysis and quantitative analysis of chemical compositions of members constituting the semiconductor device and the semiconductor memory device in the present specification can be performed by, for example, secondary ion mass spectrometry (SIMS), energy dispersive X-ray spectroscopy (EDX), or rutherford back-scattering spectroscopy (RBS). For example, a transmission electron microscope (TEM) can be used for measuring a thickness of the members constituting the semiconductor device and the semiconductor memory device, a distance between the members, a crystal grain size, and the like. Carrier concentration of the members constituting the semiconductor device and the semiconductor memory device can be measured by, for example, scanning spreading resistance microscopy (SSRM).

First Embodiment

A semiconductor device according to the first embodiment includes: a first electrode; a second electrode; an oxide semiconductor layer provided between the first electrode and the second electrode; a gate electrode provided between the first electrode and the second electrode in a first direction from the first electrode toward the second electrode and opposed to the oxide semiconductor layer; a gate insulating layer provided between the oxide semiconductor layer and the gate electrode; a first insulating layer provided between the gate electrode and the first electrode; and a second insulating layer provided between the gate electrode and the second electrode and having an oxygen atom concentration lower than an oxygen atom concentration of the first insulating layer.

Figure 2:
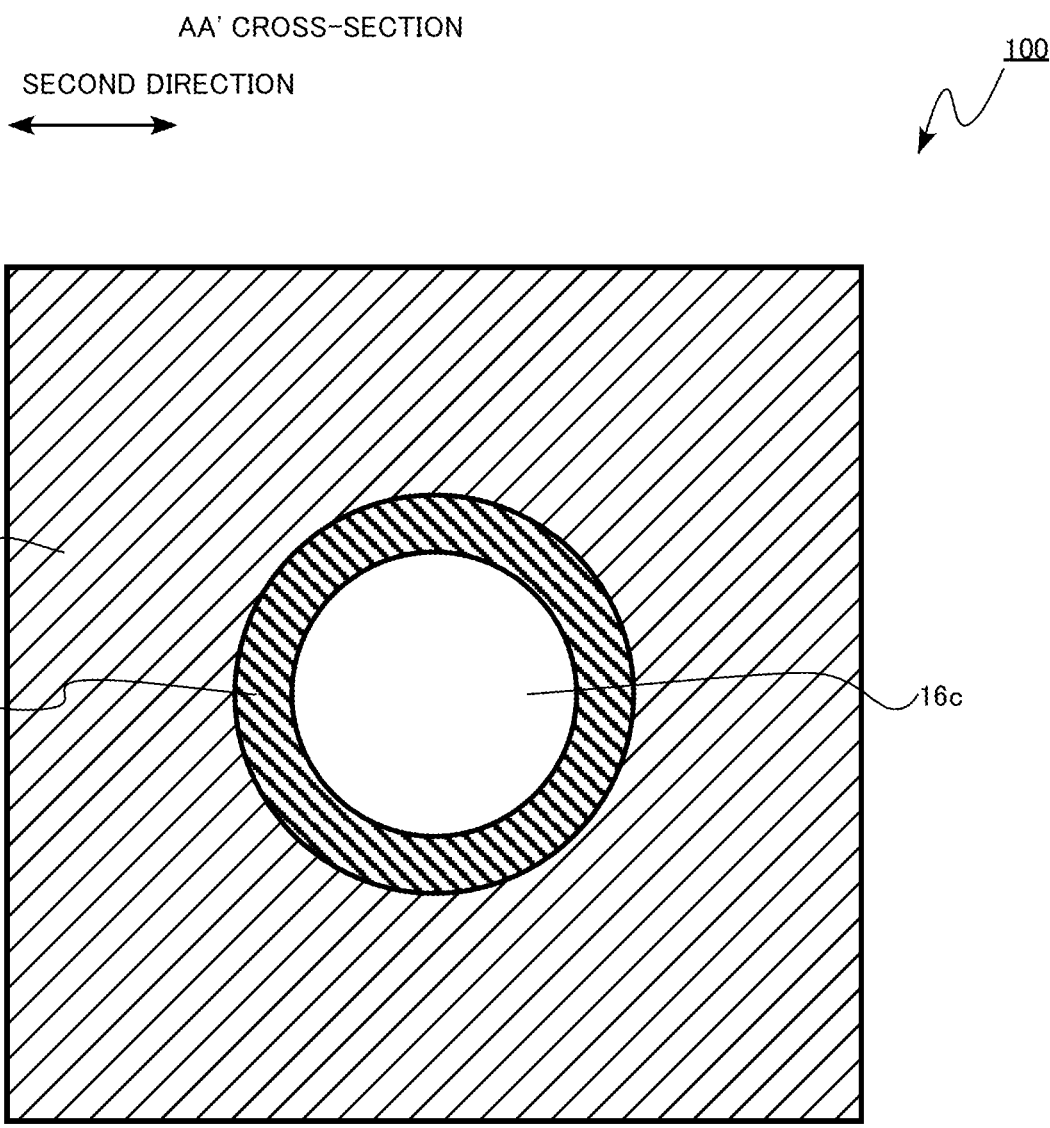
FIG. 2 is a schematic cross-sectional view of the semiconductor device according to the first embodiment.
Figure 3:
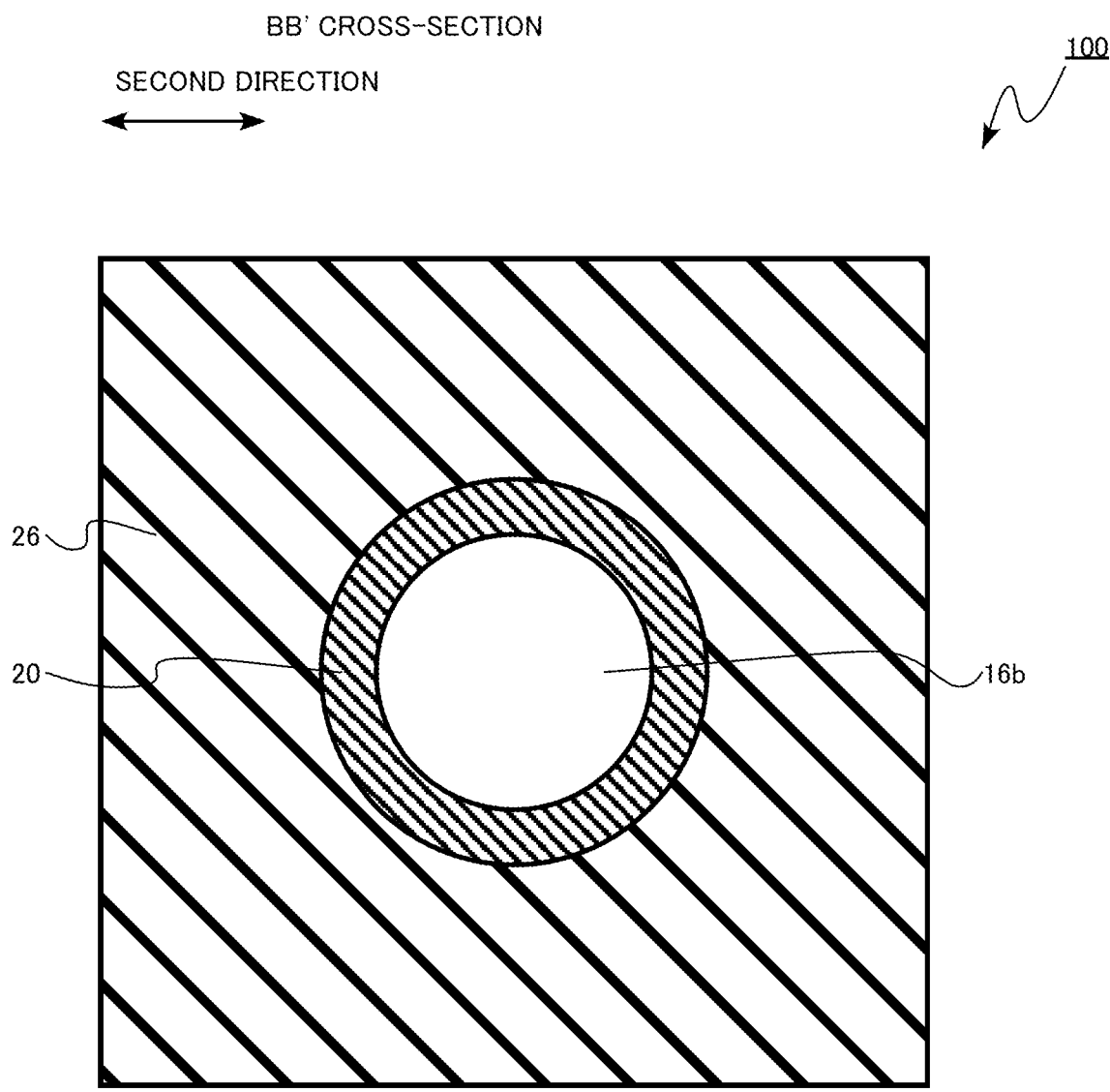
FIG. 3 is a schematic cross-sectional view of the semiconductor device according to the first embodiment.

FIGS. 1, 2, and 3 are schematic cross-sectional views of the semiconductor device according to the first embodiment.

FIG. 2 is a cross-sectional view taken along line A-A' of FIG. 1. FIG. 3 is a cross-sectional view taken along line B-B' of FIG. 1. In FIG. 1, a vertical direction is referred to as a first direction. In FIG. 1, a horizontal direction is referred to as a second direction. The second direction is perpendicular to the first direction.

The semiconductor device of the first embodiment is a transistor 100. The transistor 100 is an oxide semiconductor transistor in which a channel is formed in an oxide semiconductor layer. The transistor 100 is a so-called surrounding gate transistor (SGT) in which a gate electrode is provided to surround an oxide semiconductor layer in which the channel is formed. The transistor 100 is a so-called vertical transistor.

The transistor 100 includes a silicon substrate 10, a lower electrode 12, an upper electrode 14, an oxide semiconductor layer 16, a gate electrode 18, a gate insulating layer 20, a substrate insulating layer 22, a lower insulating layer 24, and an upper insulating layer 26. The oxide semiconductor layer 16 includes a lower region 16a, an upper region 16b, and an intermediate region 16c.

The silicon substrate 10 is an example of a substrate. The lower electrode 12 is an example of a first electrode. The upper electrode 14 is an example of a second electrode. The lower insulating layer 24 is an example of a first insulating layer. The upper insulating layer 26 is an example of a second insulating layer.

The silicon substrate 10 is formed of, for example, single crystal silicon. The silicon substrate 10 is an example of a substrate. The substrate is not limited to the silicon substrate. The substrate may be, for example, a semiconductor substrate other than the silicon substrate. The substrate may be, for example, an insulating substrate.

The lower electrode 12 is provided on the silicon substrate 10. The substrate insulating layer 22 is provided between the silicon substrate 10 and the lower electrode 12. The lower electrode 12 is an example of a first electrode.

The lower electrode 12 functions as a source electrode or drain electrode of the transistor 100.

The lower electrode 12 is formed of a conductor. The lower electrode 12 contains, for example, an oxide conductor or a metal. The lower electrode 12 is formed of, for example, an oxide conductor containing indium (In) and tin (Sn). The lower electrode 12 is formed of, for example, a metal containing tungsten (W), molybdenum (Mo), copper (Cu), aluminum (Al), titanium (Ti), or tantalum (Ta).

The lower electrode 12 may have, for example, a stacked structure of a plurality of the conductors.

The upper electrode 14 is provided on the silicon substrate 10. The upper electrode 14 is provided on the lower electrode 12. The lower electrode 12 is provided between the silicon substrate 10 and the upper electrode 14. The upper electrode 14 is an example of a second electrode. A direction from the lower electrode 12 toward the upper electrode 14 is the first direction.

The upper electrode 14 functions as the source electrode or drain electrode of the transistor 100.

The upper electrode 14 is formed of a conductor. The upper electrode 14 contains, for example, an oxide conductor or a metal. The upper electrode 14 is formed of, for example, an oxide conductor containing indium (In) and tin (Sn). The upper electrode 14 is formed of, for example, a metal containing tungsten (W), molybdenum (Mo), copper (Cu), aluminum (Al), titanium (Ti), or tantalum (Ta).

The upper electrode 14 may have, for example, a stacked structure of a plurality of the conductors.

The oxide semiconductor layer 16 is provided on the silicon substrate 10. The oxide semiconductor layer 16 is provided between the lower electrode 12 and the upper electrode 14. For example, the oxide semiconductor layer 16 is in contact with the lower electrode 12. For example, the oxide semiconductor layer 16 is in contact with the upper electrode 14.

In the oxide semiconductor layer 16, a channel serving as a current path is formed when the transistor 100 is turned on.

The oxide semiconductor layer 16 is an oxide semiconductor. The oxide semiconductor layer 16 is, for example, amorphous.

The oxide semiconductor layer 16 contains, for example, at least one element selected from the group consisting of indium (In), gallium (Ga), silicon (Si), aluminum (Al), and tin (Sn), and zinc (Zn). The oxide semiconductor layer 16 contains, for example, indium (In), gallium (Ga), and zinc (Zn). An atomic concentration of zinc (Zn) in the oxide semiconductor layer 16 is, for example, equal to or more than 5 atom % and equal to or less than 20 atom %.

The oxide semiconductor layer 16 contains, for example, at least one element selected from the group consisting of titanium (Ti), zinc (Zn), and tungsten (W). The oxide semiconductor layer 16 contains, for example, titanium oxide, zinc oxide, or tungsten oxide.

The oxide semiconductor layer 16 has, for example, a chemical composition different from a chemical composition of the lower electrode 12 and a chemical composition of the upper electrode 14.

The oxide semiconductor layer 16 includes a lower region 16a, an upper region 16b, and an intermediate region 16c. The intermediate region 16c is provided between the lower region 16a and the upper region 16b. The lower region 16a is provided between the lower electrode 12 and the intermediate region 16c. The upper region 16b is provided between the intermediate region 16c and the upper electrode 14.

The oxide semiconductor layer 16 includes, for example, an oxygen vacancy. The oxygen vacancy of the oxide semiconductor layer 16 functions as a donor.

For example, an oxygen vacancy concentration of the lower region 16a is higher than an oxygen vacancy concentration of the intermediate region 16c. The oxygen vacancy of the lower region 16a is formed, for example, by the lower electrode 12 absorbing oxygen of the lower region 16a. The lower region 16a is an n-type semiconductor. A carrier concentration of the lower region 16a is higher than a carrier concentration of the intermediate region 16c. The lower region 16a functions as a source region or drain region of the transistor 100.

For example, an oxygen vacancy concentration of the upper region 16b is higher than the oxygen vacancy concentration of the intermediate region 16c. The oxygen vacancy of the upper region 16b is formed, for example, by the upper electrode 14 absorbing oxygen of the upper region 16b. The upper region 16b is the n-type semiconductor. A carrier concentration of the upper region 16b is higher than the carrier concentration of the intermediate region 16c. The upper region 16b functions as the source region or drain region of the transistor 100.

The intermediate region 16c is opposed to the gate electrode 18. The intermediate region 16c functions as a channel region of the transistor 100.

A length of the oxide semiconductor layer 16 in the first direction is, for example, equal to or more than 80 nm and equal to or less than 200 nm. A width of the oxide semiconductor layer 16 in the second direction is, for example, equal to or more than 20 nm and equal to or less than 100 nm.

The gate electrode 18 is provided between the lower electrode 12 and the upper electrode 14 in the first direction. The gate electrode 18 is opposed to the oxide semiconductor layer 16.

The gate electrode 18 is provided to surround the oxide semiconductor layer 16. The gate electrode 18 is provided around the oxide semiconductor layer 16.

The gate electrode 18 is formed of, for example, metal, a metal compound, or a semiconductor. The gate electrode 18 contains, for example, tungsten (W).

A gate length of the gate electrode 18 is, for example, equal to or more than 20 nm and equal to or less than 100 nm. The gate length of the gate electrode 18 is a length of the gate electrode 18 in the first direction.

The gate insulating layer 20 is provided between the oxide semiconductor layer 16 and the gate electrode 18. The gate insulating layer 20 is provided to surround the oxide semiconductor layer 16.

For example, the gate insulating layer 20 is in contact with the lower electrode 12. For example, the gate insulating layer 20 is in contact with the upper electrode 14.

The gate insulating layer 20 is formed of, for example, an oxide or an oxynitride. The gate insulating layer 20 is formed of, for example, silicon oxide or aluminum oxide. A thickness of the gate insulating layer 20 is, for example, equal to or more than 2 nm and equal to or less than 10 nm.

The substrate insulating layer 22 is provided between the silicon substrate 10 and the lower electrode 12. The substrate insulating layer 22 is formed of, for example, an oxide, a nitride, or an oxynitride. The substrate insulating layer 22 contains, for example, silicon oxide, silicon nitride, or silicon oxynitride. The substrate insulating layer 22 is formed of, for example, silicon oxide, silicon nitride, or silicon oxynitride.

The lower insulating layer 24 is provided on the lower electrode 12. The lower insulating layer 24 is provided between the gate electrode 18 and the lower electrode 12.

The lower insulating layer 24 surrounds the lower region 16a of the oxide semiconductor layer 16. The lower insulating layer 24 surrounds the gate insulating layer 20. The gate insulating layer 20 is provided between the lower insulating layer 24 and the lower region 16a.

The lower insulating layer 24 is formed of, for example, an oxide or an oxynitride. The lower insulating layer 24 contains, for example, silicon oxide or silicon oxynitride. The lower insulating layer 24 is formed of, for example, a silicon oxide layer or a silicon oxynitride layer. The lower insulating layer 24 is for example, the silicon oxide layer or the silicon oxynitride layer.

The upper insulating layer 26 is provided on the gate electrode 18. The upper insulating layer 26 is provided between the gate electrode 18 and the upper electrode 14.

The upper insulating layer 26 surrounds the upper region 16b of the oxide semiconductor layer 16. The upper insulating layer 26 surrounds the gate insulating layer 20. The gate insulating layer 20 is provided between the upper insulating layer 26 and the upper region 16b.

An oxygen atom concentration of the upper insulating layer 26 is lower than the oxygen atom concentration of the lower insulating layer 24. The oxygen atom concentration of the upper insulating layer 26 is, for example, equal to or less than half of the oxygen atom concentration of the lower insulating layer 24.

The upper insulating layer 26 is formed of, for example, an oxide, a nitride, or an oxynitride. The upper insulating layer 26 is formed of, for example, silicon oxide, silicon nitride, or silicon oxynitride. The upper insulating layer 26 contains, for example, a silicon oxide layer, a silicon oxynitride layer, or a silicon nitride layer. The upper insulating layer 26 is, for example, the silicon oxide layer, the silicon oxynitride layer, or the silicon nitride layer.

For example, in a case where the lower insulating layer 24 is the silicon oxide layer, the upper insulating layer 26 is the silicon nitride layer. For example, in a case where the lower insulating layer 24 is the silicon oxide layer, the upper insulating layer 26 is the silicon oxynitride layer.

For example, in a case where the lower insulating layer 24 is the silicon oxide layer, the upper insulating layer 26 is the silicon oxide layer having an oxygen concentration relatively lower than that of the lower insulating layer 24. For example, in a case where the lower insulating layer 24 is the silicon oxide layer whose atomic ratio (Si/O) of silicon (Si) to oxygen (O) is ½, the upper insulating layer 26 is the silicon oxide layer whose atomic ratio (Si/O) of silicon (Si) to oxygen (O) is higher than ½.

When the transistor 100 is manufactured, the oxide semiconductor layer 16 and the upper electrode 14 are formed in this order after the lower electrode 12 is formed on the silicon substrate 10.

Hereinafter, a function and an effect of the semiconductor device according to the first embodiment will be described.

An oxide semiconductor transistor, in which a channel is formed in an oxide semiconductor layer, has an excellent characteristic that a channel leakage current during an off operation is extremely small. Therefore, for example, applying the oxide semiconductor transistor to a switching transistor of a memory cell of a DRAM has been studied.

For example, in a case where the oxide semiconductor transistor is applied to the switching transistor of the memory cell, a characteristic change of the oxide semiconductor transistor may occur due to a heat treatment performed after the transistor structure is formed. Therefore, it is expected to realize an oxide semiconductor transistor having a small characteristic change and a stable characteristic even after the heat treatment.

Figure 4:
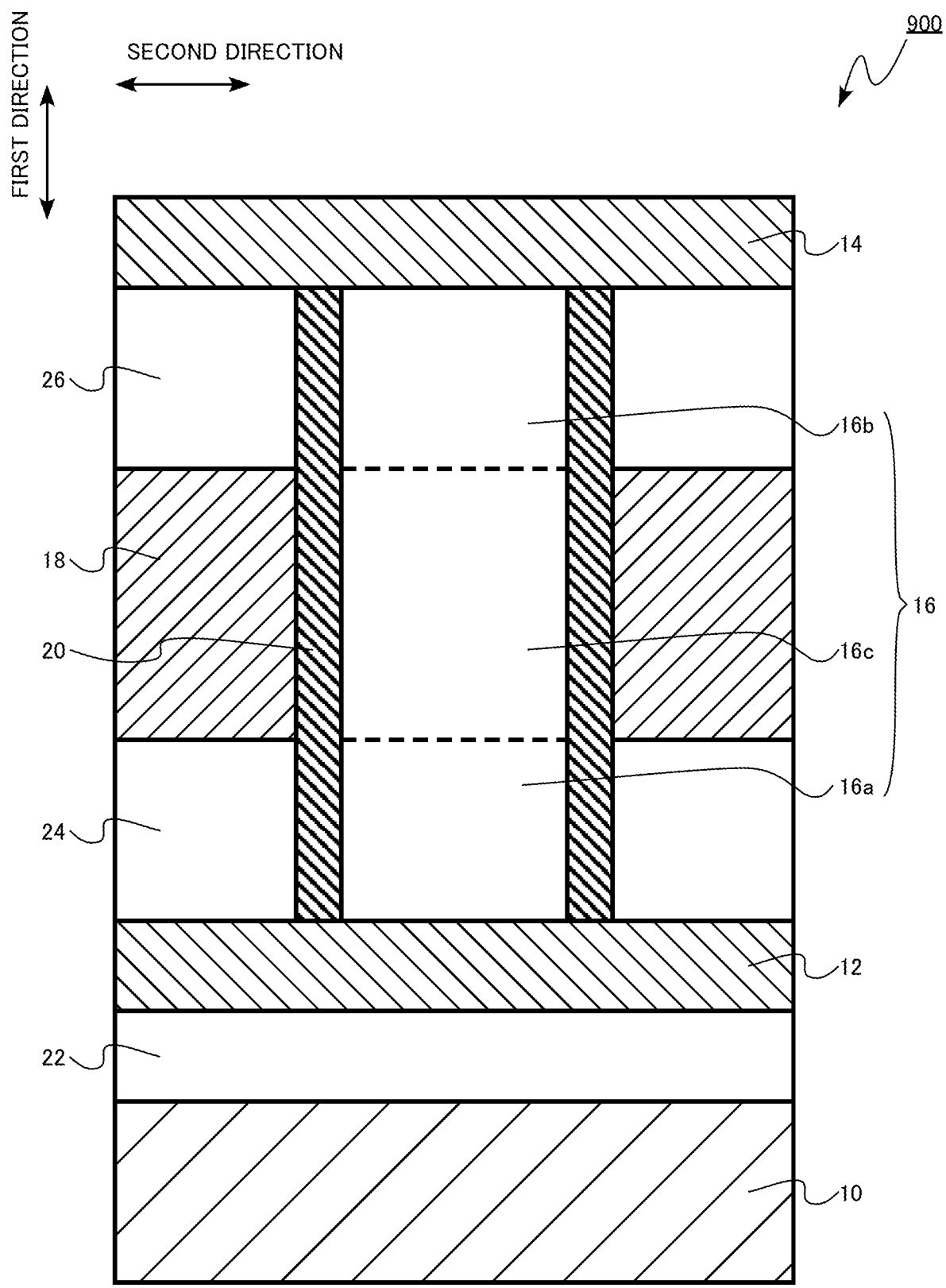
FIG. 4 is a schematic cross-sectional view of a semiconductor device according to a comparative example.

FIG. 4 is a schematic cross-sectional view of a semiconductor device according to a comparative example. FIG. 4 is a view corresponding to FIG. 1 of the semiconductor device according to the first embodiment.

The semiconductor device of the comparative example is a transistor 900. The transistor 900 is an oxide semiconductor transistor in which a channel is formed in an oxide semiconductor layer. The transistor 900 is different from the transistor 100 of the first embodiment in that the oxygen atom concentration of the upper insulating layer 26 is equal to the oxygen atom concentration of the lower insulating layer 24. The lower insulating layer 24 and the upper insulating layer 26 are, for example, silicon oxide layers.

The characteristic of the transistor 900 of the comparative example varies due to the heat treatment performed after the transistor structure is formed. In particular, in a case where the heat treatment is performed in an atmosphere containing oxygen, asymmetry of an on-state current becomes a problem. The asymmetry of the on-state current means that there is a difference in magnitude of the on-state current in a case where the current flows from the upper electrode 14 toward the lower electrode 12 and in a case where the current flows from the lower electrode 12 toward the upper electrode 14.

One of the causes of the asymmetry of the on-state current is considered to be a difference between the oxygen vacancy concentration of the lower region 16a of the oxide semiconductor layer 16 and the oxygen vacancy concentration of the upper region 16b of the oxide semiconductor layer 16 after the heat treatment performed after the transistor structure is formed. For example, when the oxygen vacancy concentration of the upper region 16b decreases, the carrier concentration of the upper region 16b decreases. As the carrier concentration of the upper region 16b decreases, a contact resistance between the upper region 16b and the upper electrode 14 increases. Therefore, as the asymmetry of the parasitic resistance is generated between an upper portion of the transistor structure and a lower portion of the transistor structure, the asymmetry of the on-state current of the transistor 900 is generated.

Figure 5:
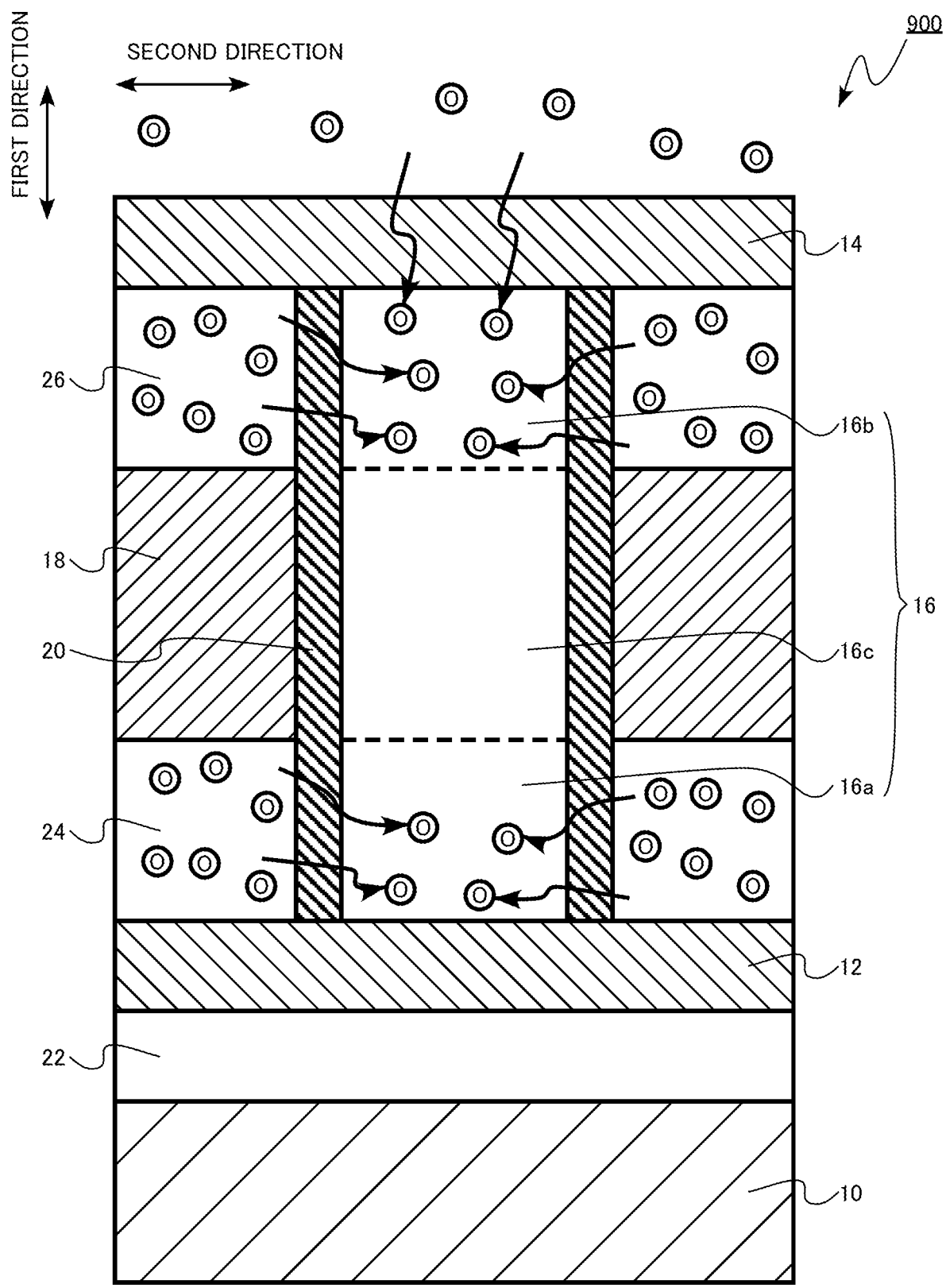
FIG. 5 is an explanatory diagram of a function and an effect of the semiconductor device according to the first embodiment.

FIG. 5 is an explanatory diagram of a function and an effect of the semiconductor device according to the first embodiment. FIG. 5 illustrates a state in which the heat treatment is performed in the atmosphere containing oxygen after the transistor structure of the transistor 900 of the comparative example is formed.

Oxygen is supplied to the lower region 16a and the upper region 16b from the atmosphere. The oxygen is supplied to the lower region 16a from the lower insulating layer 24 formed of a silicon oxide layer. The oxygen is supplied to the upper region 16b from the upper insulating layer 26 formed of the silicon oxide layer.

The oxygen vacancies are filled with the oxygen supplied to the lower region 16a and the upper region 16b. An amount of the oxygen in the atmosphere is greater in the upper region 16b as compared with the lower region 16a. Therefore, the oxygen vacancy concentration of the upper region 16b is lower than the oxygen vacancy concentration of the lower region 16a. Accordingly, as the carrier concentration of the upper region 16b decreases more than the carrier concentration of the lower region 16a, the contact resistance between the upper region 16b and the upper electrode 14 increases.

Figure 6:
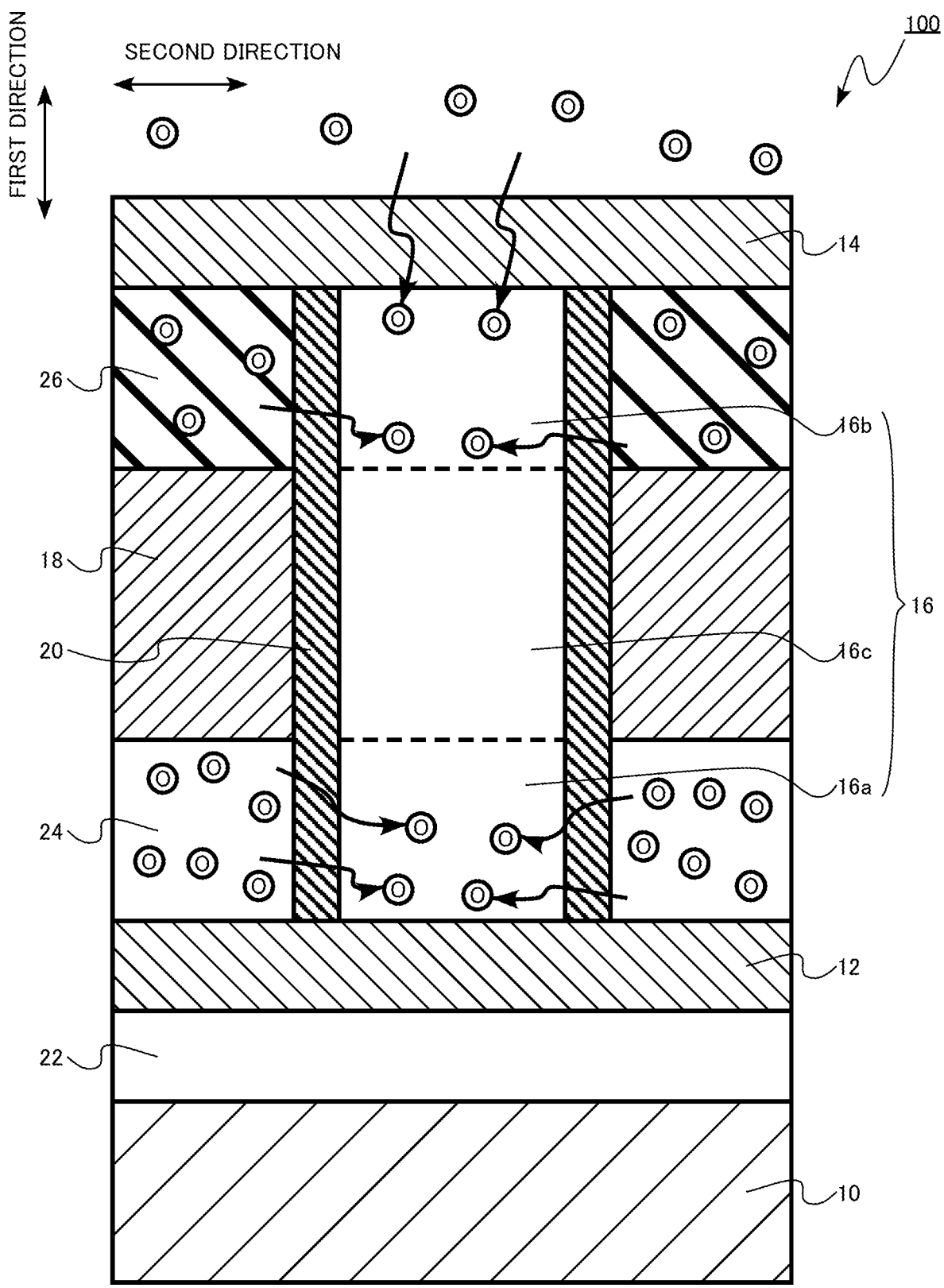
FIG. 6 is an explanatory diagram of a function and an effect of the semiconductor device according to the first embodiment.

FIG. 6 is an explanatory diagram of a function and an effect of the semiconductor device according to the first embodiment. FIG. 6 illustrates a state in which the heat treatment is performed in the atmosphere containing oxygen after the transistor structure of the transistor 100 of the first embodiment is formed.

In the transistor 100 of the first embodiment, the oxygen atom concentration of the upper insulating layer 26 is lower than the oxygen atom concentration of the lower insulating layer 24. For example, in a case where the lower insulating layer 24 is the silicon oxide layer, the upper insulating layer 26 is the silicon oxide layer having an oxygen concentration relatively lower than that of the lower insulating layer 24.

An oxygen atom concentration of the upper insulating layer 26 is lower than the oxygen atom concentration of the lower insulating layer 24. Therefore, when the heat treatment is performed, the amount of oxygen supplied from the upper insulating layer 26 toward the upper region 16b is smaller than the amount of oxygen supplied from the lower insulating layer 24 toward the lower region 16a. Therefore, a decrease in the oxygen vacancy concentration of the upper region 16b is suppressed. Accordingly, a decrease in the carrier concentration of the upper region 16b is suppressed, and an increase in the contact resistance between the upper region 16b and the upper electrode 14 is suppressed. Therefore, the development of asymmetry of the on-state current of the transistor 100 after the heat treatment is suppressed.

From the viewpoint of suppressing the supply of oxygen to the upper region 16b, the upper insulating layer 26 is preferably the silicon nitride layer. From the viewpoint of suppressing the supply of oxygen to the upper region 16b, the upper insulating layer 26 is preferably the silicon oxide layer whose atomic ratio (Si/O) of silicon (Si) to oxygen (O) is higher than ½.

From the viewpoint of suppressing the supply of oxygen to the upper region 16b, the oxygen atom concentration of the upper insulating layer 26 is preferably half or less the oxygen atom concentration of the lower insulating layer 24, more preferably one-tenth or less of the oxygen atom concentration of the lower insulating layer 24, and still more preferably one-hundredth or less of the oxygen atom concentration of the lower insulating layer 24.

As described above, according to the first embodiment, the asymmetry of the on-state current after the heat treatment is suppressed, and the oxide semiconductor transistor having a stable characteristic is realized.

Second Embodiment

A semiconductor device according to the second embodiment is different from the semiconductor device according to the first embodiment in that the second insulating layer includes a first region and a second region provided between the first region and the second electrode and having the oxygen atom concentration lower than the oxygen atom concentration of the first region. Hereinafter, descriptions overlapping with those in the first embodiment may be partially omitted.

Figure 7:
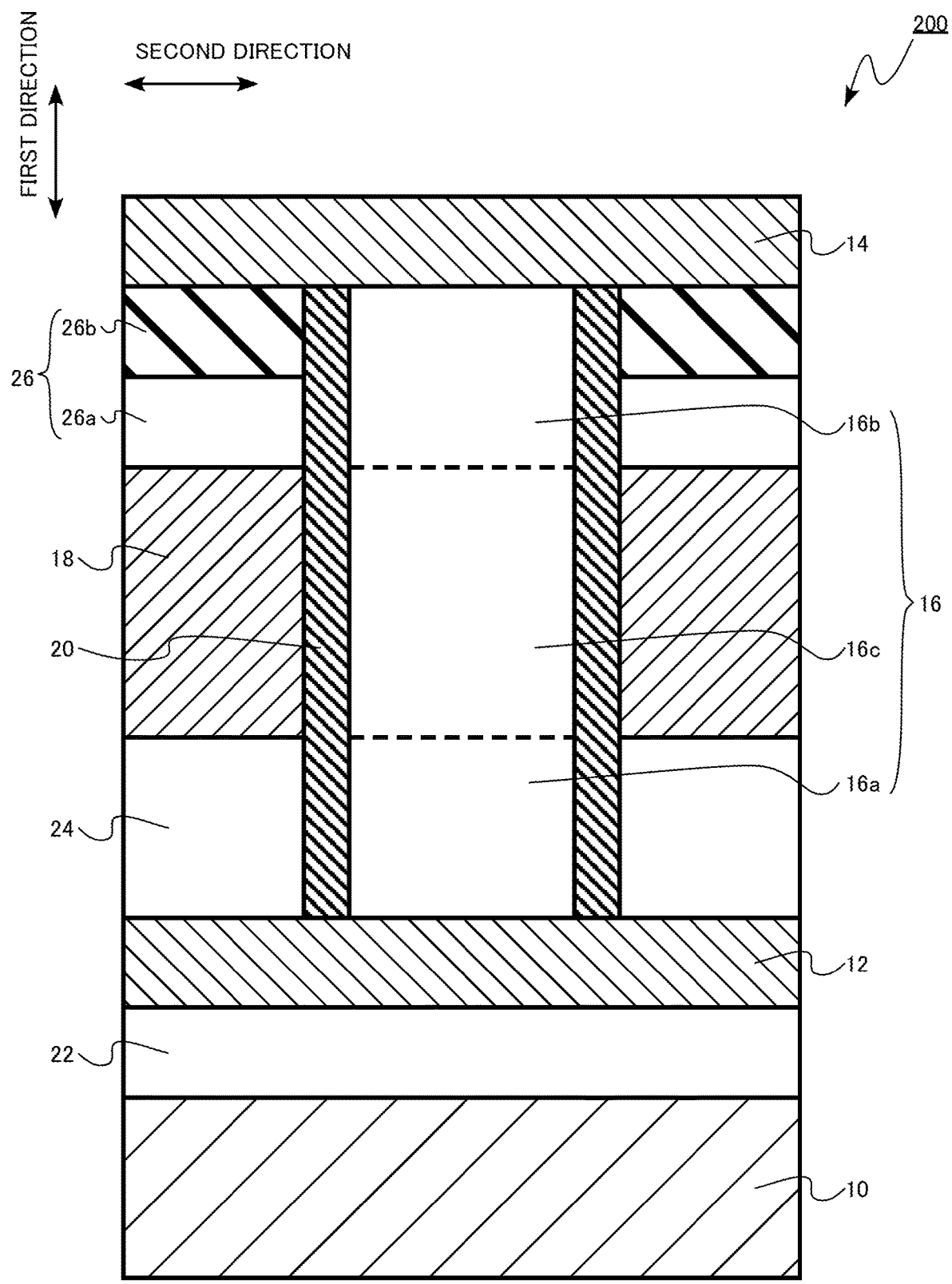
FIG. 7 is a schematic cross-sectional view of a semiconductor device according to a second embodiment.

FIG. 7 is a schematic cross-sectional view of the semiconductor device according to the second embodiment.

The semiconductor device of the second embodiment is a transistor 200. The transistor 200 is an oxide semiconductor transistor in which a channel is formed in an oxide semiconductor layer.

The transistor 200 includes a silicon substrate 10, a lower electrode 12, an upper electrode 14, an oxide semiconductor layer 16, a gate electrode 18, a gate insulating layer 20, a substrate insulating layer 22, a lower insulating layer 24, and an upper insulating layer 26. The oxide semiconductor layer 16 includes a lower region 16a, an upper region 16b, and an intermediate region 16c.

The silicon substrate 10 is an example of a substrate. The lower electrode 12 is an example of a first electrode. The upper electrode 14 is an example of a second electrode. The lower insulating layer 24 is an example of a first insulating layer. The upper insulating layer 26 is an example of a second insulating layer.

An oxygen atom concentration of the upper insulating layer 26 is lower than the oxygen atom concentration of the lower insulating layer 24. The oxygen atom concentration of the upper insulating layer 26 is, for example, equal to or less than half of the oxygen atom concentration of the lower insulating layer 24.

The upper insulating layer 26 includes a first region 26a and a second region 26b. The second region 26b is provided between the first region 26a and the upper electrode 14.

An oxygen atom concentration of the second region 26b is lower than an oxygen atom concentration of the first region 26a. The oxygen atom concentration of the first region 26a is, for example, equal to or less than half of the oxygen atom concentration of the first region 26a.

For example, in a case where the lower insulating layer 24 is a silicon oxide layer, the first region 26a is a silicon oxide layer, and the second region 26b is a silicon nitride layer. For example, in a case where the lower insulating layer 24 is a silicon oxide layer, the first region 26a is a silicon oxide layer, and the second region 26b is a silicon oxynitride layer.

For example, in a case where the lower insulating layer 24 is the silicon oxide layer, the first region 26a is the silicon oxide layer having the same oxygen concentration as that of the lower insulating layer 24, and the second region 26b is the silicon oxide layer having the oxygen concentration relatively lower than that of the lower insulating layer 24. For example, in a case where the lower insulating layer 24 and the first region 26a are the silicon oxide layers whose atomic ratio (Si/O) of silicon (Si) to oxygen (O) is ½, the second region 26b is the silicon oxide layer whose atomic ratio (Si/O) of silicon (Si) to oxygen (O) is higher than ½.

According to the second embodiment, the asymmetry of the on-state current after the heat treatment is suppressed by the same function as that in the first embodiment, and the oxide semiconductor transistor having a stable characteristic is realized.

Third Embodiment

A semiconductor device according to the third embodiment is different from the semiconductor device according to the first embodiment in that a thickness of a gate insulating layer between a second insulating layer and an oxide semiconductor layer in a second direction is smaller than a thickness of a gate insulating layer between a first insulating layer and an oxide semiconductor layer in the second direction. Hereinafter, descriptions overlapping with those in the first embodiment may be partially omitted.

Figure 8:
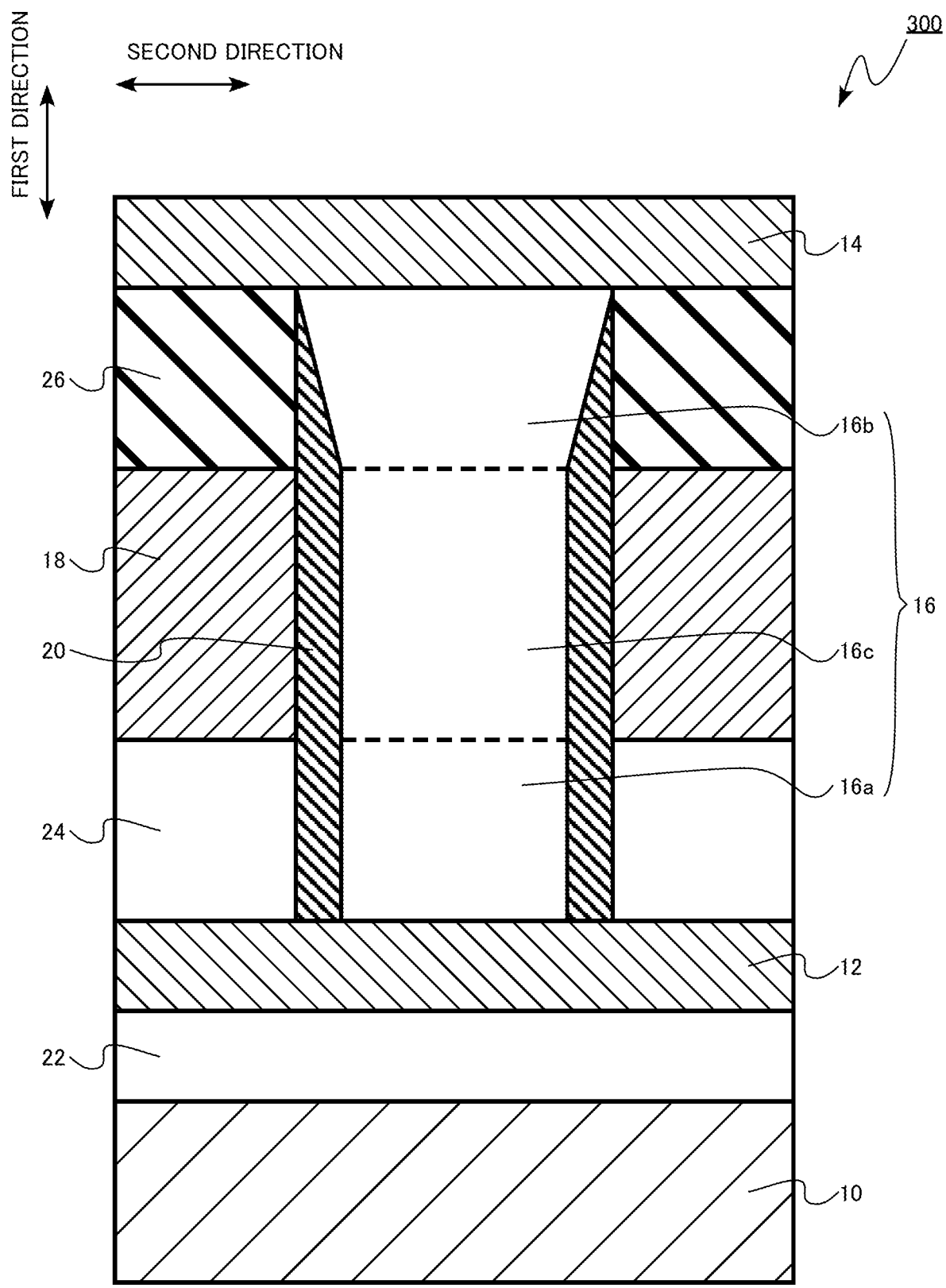
FIG. 8 is a schematic cross-sectional view of a semiconductor device according to a third embodiment.

FIG. 8 is a schematic cross-sectional view of the semiconductor device according to the third embodiment.

The semiconductor device of the third embodiment is a transistor 300. The transistor 300 is an oxide semiconductor transistor in which a channel is formed in an oxide semiconductor layer.

The transistor 300 includes a silicon substrate 10, a lower electrode 12, an upper electrode 14, an oxide semiconductor layer 16, a gate electrode 18, a gate insulating layer 20, a substrate insulating layer 22, a lower insulating layer 24, and an upper insulating layer 26. The oxide semiconductor layer 16 includes a lower region 16a, an upper region 16b, and an intermediate region 16c.

The silicon substrate 10 is an example of a substrate. The lower electrode 12 is an example of a first electrode. The upper electrode 14 is an example of a second electrode. The lower insulating layer 24 is an example of a first insulating layer. The upper insulating layer 26 is an example of a second insulating layer.

An oxygen atom concentration of the upper insulating layer 26 is lower than the oxygen atom concentration of the lower insulating layer 24. The oxygen atom concentration of the upper insulating layer 26 is, for example, equal to or less than half of the oxygen atom concentration of the lower insulating layer 24.

A thickness of the gate insulating layer 20 between the upper insulating layer 26 and the oxide semiconductor layer 16 in the second direction is smaller than a thickness of the gate insulating layer 20 between the lower insulating layer 24 and the oxide semiconductor layer 16 in the second direction. The thickness of the gate insulating layer 20 between the upper insulating layer 26 and the upper region 16b is smaller than the thickness of the gate insulating layer 20 between the lower insulating layer 24 and the lower region 16a.

In the transistor 300 of the third embodiment, a decrease in the oxygen vacancy concentration of the upper region 16b is suppressed by the same function as that of the transistor 100 of the first embodiment.

In the transistor 300 of the third embodiment, the thickness of the gate insulating layer 20 between the upper insulating layer 26 and the upper region 16b is small. Therefore, at the time of the heat treatment, oxygen is absorbed from the upper region 16b to the upper insulating layer 26. In particular, for example, in a case where the upper insulating layer 26 is a layer that does not contain oxygen, such as the silicon nitride, absorption of oxygen from the upper region 16b to the upper insulating layer 26 is promoted. Therefore, a decrease in the oxygen vacancy concentration of the upper region 16b is further suppressed.

In the transistor 300 of the third embodiment, the upper insulating layer 26 is preferably a silicon nitride layer from the viewpoint of promoting the absorption of oxygen from the upper region 16b to the upper insulating layer 26.

Modified Example

Figure 9:
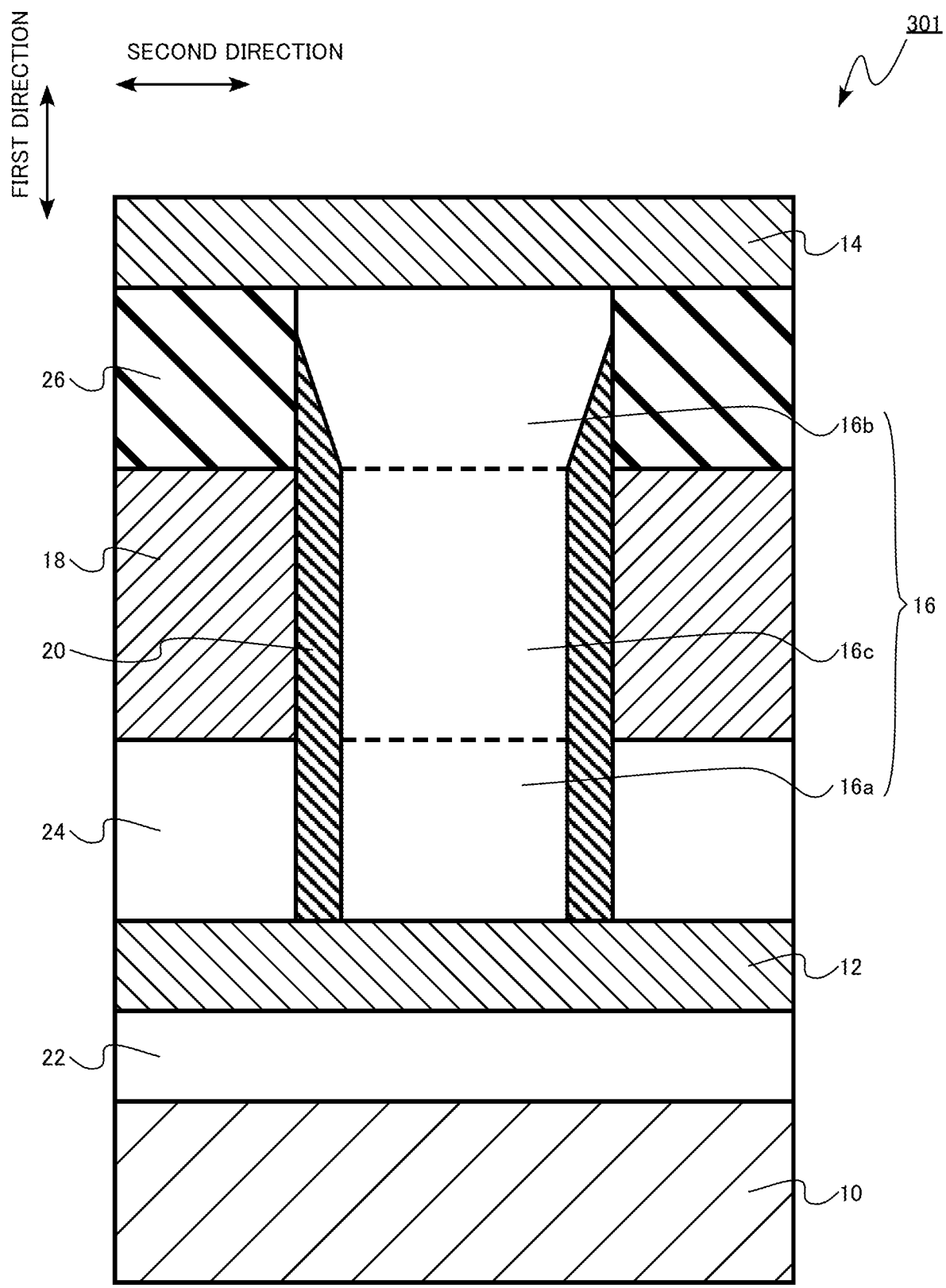
FIG. 9 is a schematic cross-sectional view of a semiconductor device according to a modified example of the third embodiment.

FIG. 9 is a schematic cross-sectional view of a semiconductor device according to the modified example of the third embodiment. The modified example of the semiconductor device of the third embodiment is a transistor 301.

The transistor 301 is different from the transistor 300 of the third embodiment in that at least a part of the upper insulating layer 26 is in contact with the oxide semiconductor layer 16. The transistor 301 is different from the transistor 300 of the third embodiment in that at least a part of the upper insulating layer 26 is in contact with the upper region 16b.

In the transistor 301, since the upper insulating layer 26 is in contact with the upper region 16b, the absorption of oxygen from the upper region 16b to the upper insulating layer 26 at the time of the heat treatment is further promoted. Therefore, a decrease in the oxygen vacancy concentration of the upper region 16b is further suppressed as compared with the transistor 300.

According to the third embodiment and the modified example, the asymmetry of the on-state current after the heat treatment is further suppressed, and the oxide semiconductor transistor having a more stable characteristic is realized.

Fourth Embodiment

A semiconductor device according to the fourth embodiment is different from the semiconductor device according to the first embodiment in that, in a cross section of an oxide semiconductor layer parallel to a first direction, a first width of the oxide semiconductor layer in a second direction perpendicular to the first direction at a first position in the oxide semiconductor layer is smaller than a second width of the oxide semiconductor layer in the second direction at a second position closer to a second electrode than the first position in the oxide semiconductor layer. Hereinafter, descriptions overlapping with those in the first embodiment may be partially omitted.

Figure 10:
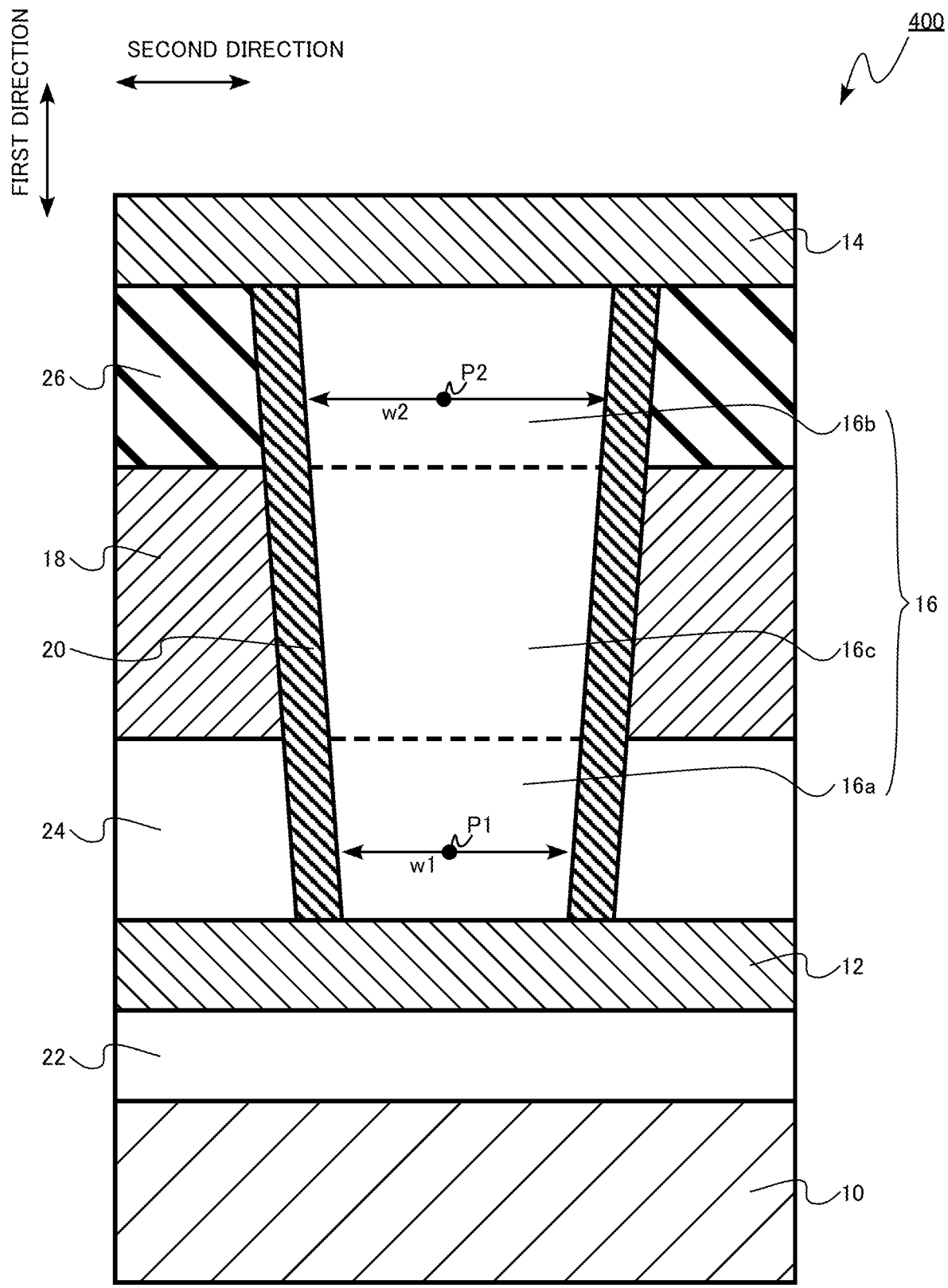
FIG. 10 is a schematic cross-sectional view of a semiconductor device according to a fourth embodiment.

FIG. 10 is a schematic cross-sectional view of the semiconductor device according to the fourth embodiment.

The semiconductor device of the fourth embodiment is a transistor 400. The transistor 400 is an oxide semiconductor transistor in which a channel is formed in an oxide semiconductor layer.

The transistor 400 includes a silicon substrate 10, a lower electrode 12, an upper electrode 14, an oxide semiconductor layer 16, a gate electrode 18, a gate insulating layer 20, a substrate insulating layer 22, a lower insulating layer 24, and an upper insulating layer 26. The oxide semiconductor layer 16 includes a lower region 16a, an upper region 16b, and an intermediate region 16c.

The silicon substrate 10 is an example of a substrate. The lower electrode 12 is an example of a first electrode. The upper electrode 14 is an example of a second electrode. The lower insulating layer 24 is an example of a first insulating layer. The upper insulating layer 26 is an example of a second insulating layer.

An oxygen atom concentration of the upper insulating layer 26 is lower than the oxygen atom concentration of the lower insulating layer 24. The oxygen atom concentration of the upper insulating layer 26 is, for example, equal to or less than half of the oxygen atom concentration of the lower insulating layer 24.

In a cross section of the oxide semiconductor layer 16 parallel to a first direction, a first width (w1 in FIG. 10) of the oxide semiconductor layer 16 in a second direction perpendicular to the first direction at a first position (P1 in FIG. 10) in the oxide semiconductor layer 16 is smaller than a second width (w2 in FIG. 10) of the oxide semiconductor layer 16 in the second direction at a second position (P2 in FIG. 10) closer to the upper electrode 14 than the first position P1 in the oxide semiconductor layer 16.

For example, the width of the oxide semiconductor layer 16 in the second direction decreases as being directed from the upper electrode 14 toward the lower electrode 12. A side face of the oxide semiconductor layer 16 has a tapered shape.

According to the fourth embodiment, the asymmetry of the on-state current after the heat treatment is suppressed by the same function as that in the first embodiment, and the oxide semiconductor transistor having a stable characteristic is realized.

Fifth Embodiment

A semiconductor device according to the fifth embodiment is different from the semiconductor device according to the fourth embodiment in that a third insulating layer, which is surrounded by a second insulating layer, is surrounded by an oxide semiconductor layer, and has an oxygen atom concentration lower than an oxygen atom concentration of a first insulating layer, is provided. Hereinafter, descriptions overlapping with those in the first embodiment or the fourth embodiment will be partially omitted.

Figure 11:
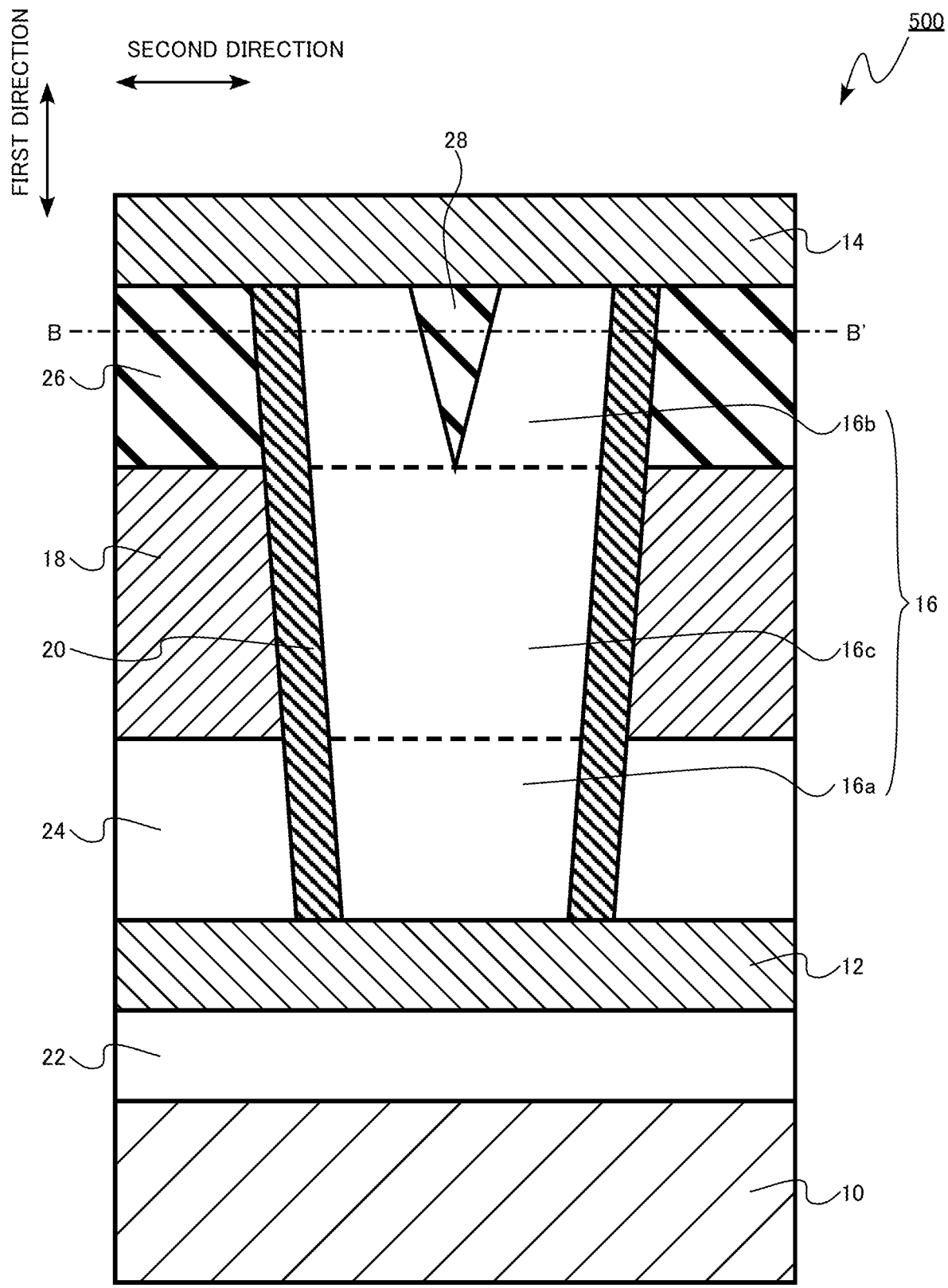
FIG. 11 is a schematic cross-sectional view of a semiconductor device according to a fifth embodiment.
Figure 12:
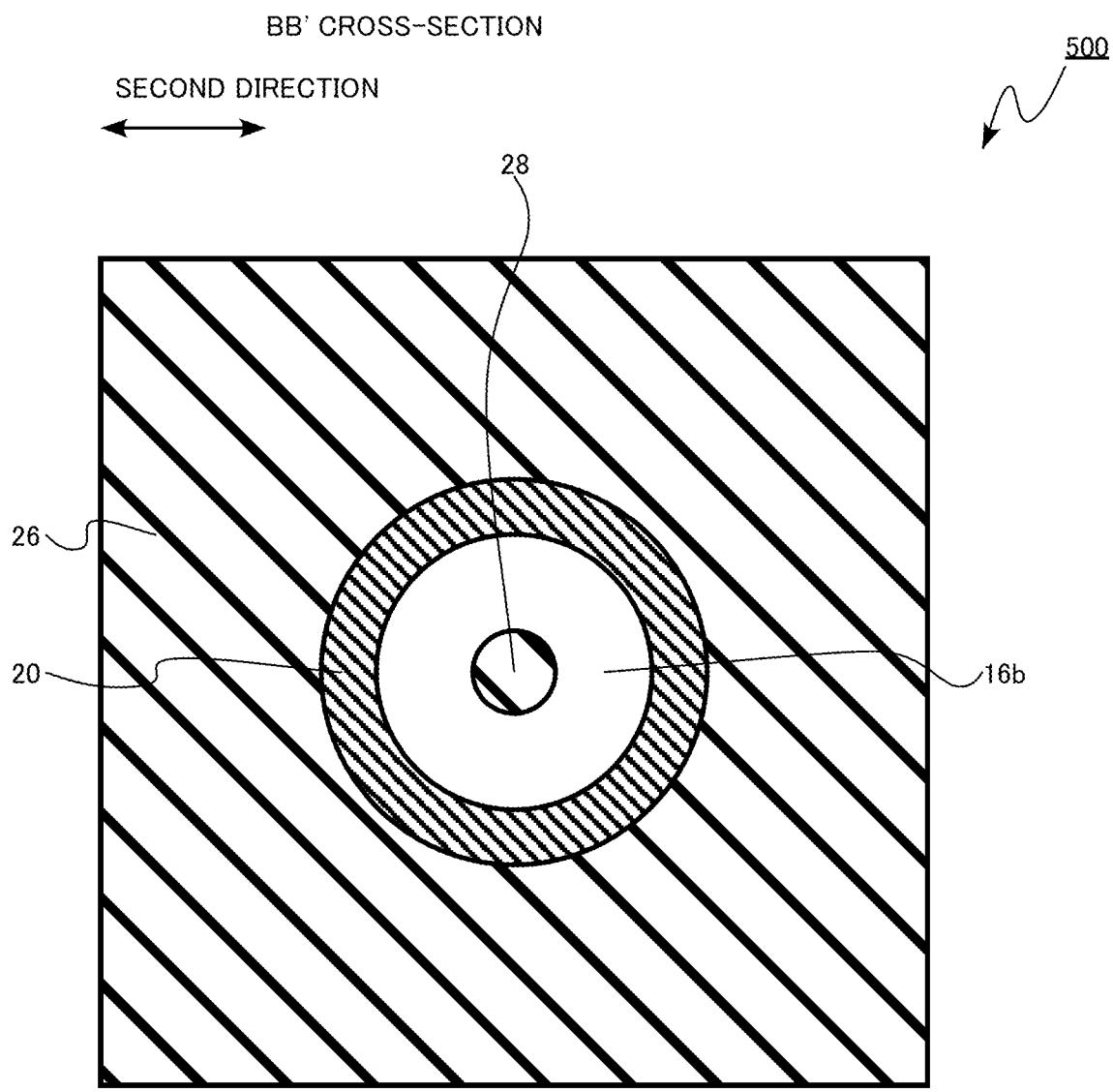
FIG. 12 is a schematic cross-sectional view of the semiconductor device according to the fifth embodiment.

FIGS. 11 and 12 are schematic cross-sectional views of the semiconductor device according to the fifth embodiment. FIG. 12 is a cross-sectional view taken along line B-B' of FIG. 11.

The semiconductor device of the fifth embodiment is a transistor 500. The transistor 500 is an oxide semiconductor transistor in which a channel is formed in an oxide semiconductor layer.

The transistor 500 includes a silicon substrate 10, a lower electrode 12, an upper electrode 14, an oxide semiconductor layer 16, a gate electrode 18, a gate insulating layer 20, a substrate insulating layer 22, a lower insulating layer 24, an upper insulating layer 26, and a core insulating layer 28. The oxide semiconductor layer 16 includes a lower region 16a, an upper region 16b, and an intermediate region 16c.

The silicon substrate 10 is an example of a substrate. The lower electrode 12 is an example of a first electrode. The upper electrode 14 is an example of a second electrode. The lower insulating layer 24 is an example of a first insulating layer. The upper insulating layer 26 is an example of a second insulating layer. The core insulating layer 28 is an example of a third insulating layer.

An oxygen atom concentration of the upper insulating layer 26 is lower than the oxygen atom concentration of the lower insulating layer 24. The oxygen atom concentration of the upper insulating layer 26 is, for example, equal to or less than half of the oxygen atom concentration of the lower insulating layer 24.

For example, the width of the oxide semiconductor layer 16 in the second direction decreases as being directed from the upper electrode 14 toward the lower electrode 12. A side face of the oxide semiconductor layer 16 has a tapered shape.

The core insulating layer 28 is surrounded by the upper insulating layer 26. The core insulating layer 28 is surrounded by the oxide semiconductor layer 16. The core insulating layer 28 is in contact with the oxide semiconductor layer 16. The core insulating layer 28 is in contact with the upper region 16b. The core insulating layer 28 extends in the first direction.

For example, a width of the core insulating layer 28 in the second direction decreases as being directed from the upper electrode 14 toward the lower electrode 12. A side face of the core insulating layer 28 has a tapered shape. For example, a position of a lower most portion of the core insulating layer 28 in the second direction is above a position of an upper surface of the gate electrode 18 in the second direction.

An oxygen atom concentration of the core insulating layer 28 is lower than the oxygen atom concentration of the lower insulating layer 24. The oxygen atom concentration of the core insulating layer 28 is, for example, equal to or less than half of the oxygen atom concentration of the lower insulating layer 24.

The core insulating layer 28 is formed of, for example, an oxide, a nitride, or an oxynitride. The core insulating layer 28 contains, for example, silicon oxide, silicon nitride, or silicon oxynitride. The core insulating layer 28 contains, for example, a silicon oxide layer, a silicon oxynitride layer, or a silicon nitride layer. The core insulating layer 28 is, for example, the silicon oxide layer, the silicon oxynitride layer, or the silicon nitride layer.

The core insulating layer 28 is formed of, for example, the same material as that of the upper insulating layer 26.

In the transistor 500 of the fifth embodiment, a decrease in the oxygen vacancy concentration of the upper region 16b is suppressed by the same function as that of the transistor 100 of the first embodiment.

The transistor 500 of the fifth embodiment includes the core insulating layer 28 which has a low oxygen atom concentration and is in contact with the upper region 16b of the oxide semiconductor layer 16. Therefore, at the time of the heat treatment, oxygen is absorbed from the upper region 16b to the core insulating layer 28. In particular, for example, in a case where the core insulating layer 28 is a layer that does not contain oxygen, such as the silicon nitride, the absorption of oxygen from the upper region 16b to the core insulating layer 28 is promoted. Therefore, a decrease in the oxygen vacancy concentration of the upper region 16b is further suppressed.

In the transistor 500 of the fifth embodiment, the core insulating layer 28 is preferably a silicon nitride layer from the viewpoint of promoting the absorption of oxygen from the upper region 16b to the core insulating layer 28.

Modified Example

Figure 13:
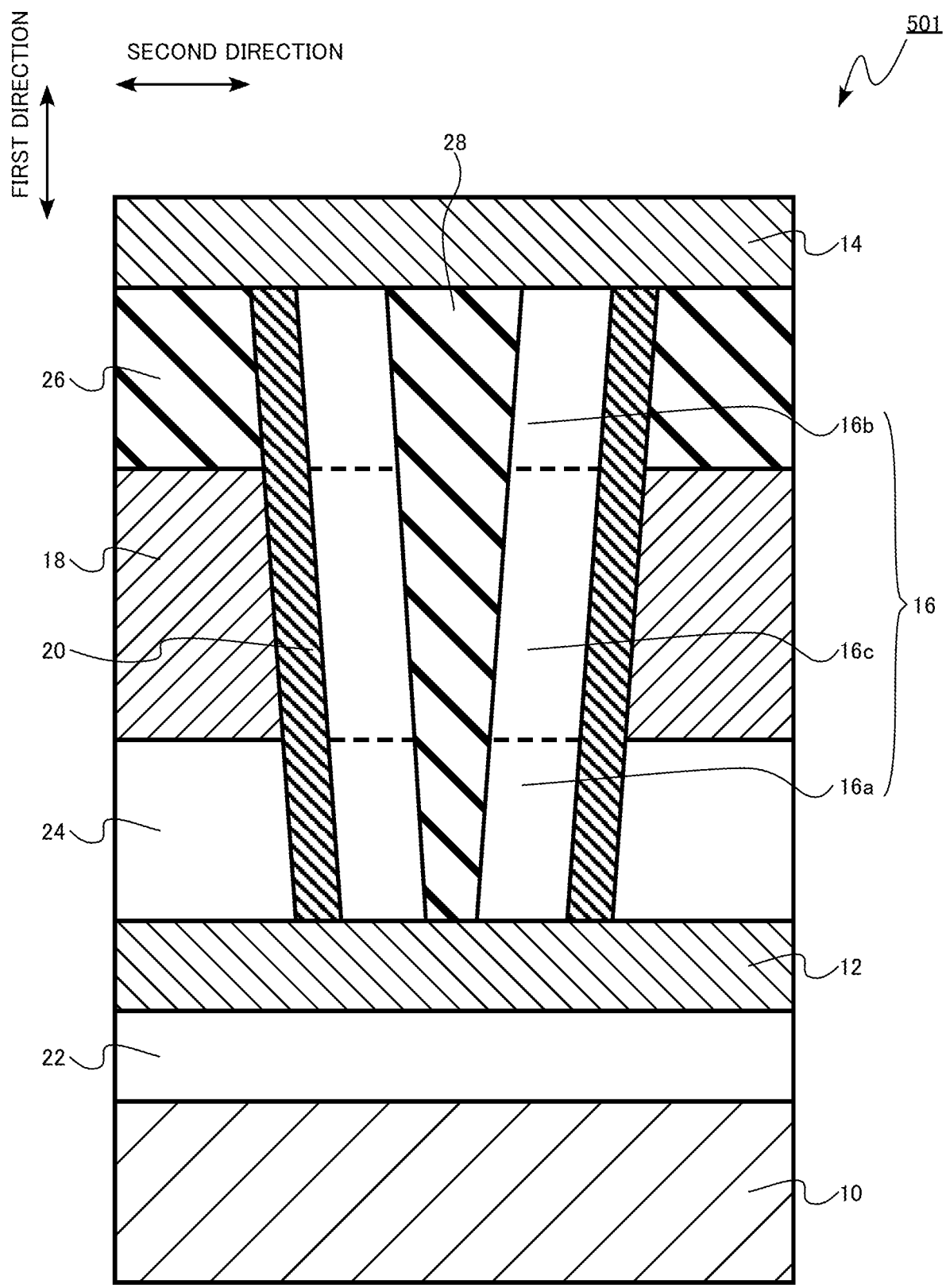
FIG. 13 is a schematic cross-sectional view of a semiconductor device according to a modified example of the fifth embodiment.

FIG. 13 is a schematic cross-sectional view of a semiconductor device according to a modified example of the fifth embodiment. The modified example of the semiconductor device of the fifth embodiment is a transistor 501.

The transistor 501 is different from the transistor 500 of the fifth embodiment in that the core insulating layer 28 is in contact with the lower electrode 12. The core insulating layer 28 is surrounded by the lower region 16a, the intermediate region 16c, and the upper region 16b. The core insulating layer 28 is in contact with the lower region 16a, the intermediate region 16c, and the upper region 16b.

Since the transistor 501 includes the core insulating layer 28, a decrease in the oxygen vacancy concentration of the upper region 16b is suppressed by the same function as that of the transistor 500 of the fifth embodiment.

According to the fifth embodiment and the modified example, the asymmetry of the on-state current after the heat treatment is further suppressed, and the oxide semiconductor transistor having a more stable characteristic is realized.

Sixth Embodiment

A semiconductor device of the sixth embodiment is different from the semiconductor device of the first embodiment in that a substrate is provided with a second electrode between the substrate and a first electrode. Hereinafter, descriptions overlapping with those in the first embodiment may be partially omitted.

Figure 14:
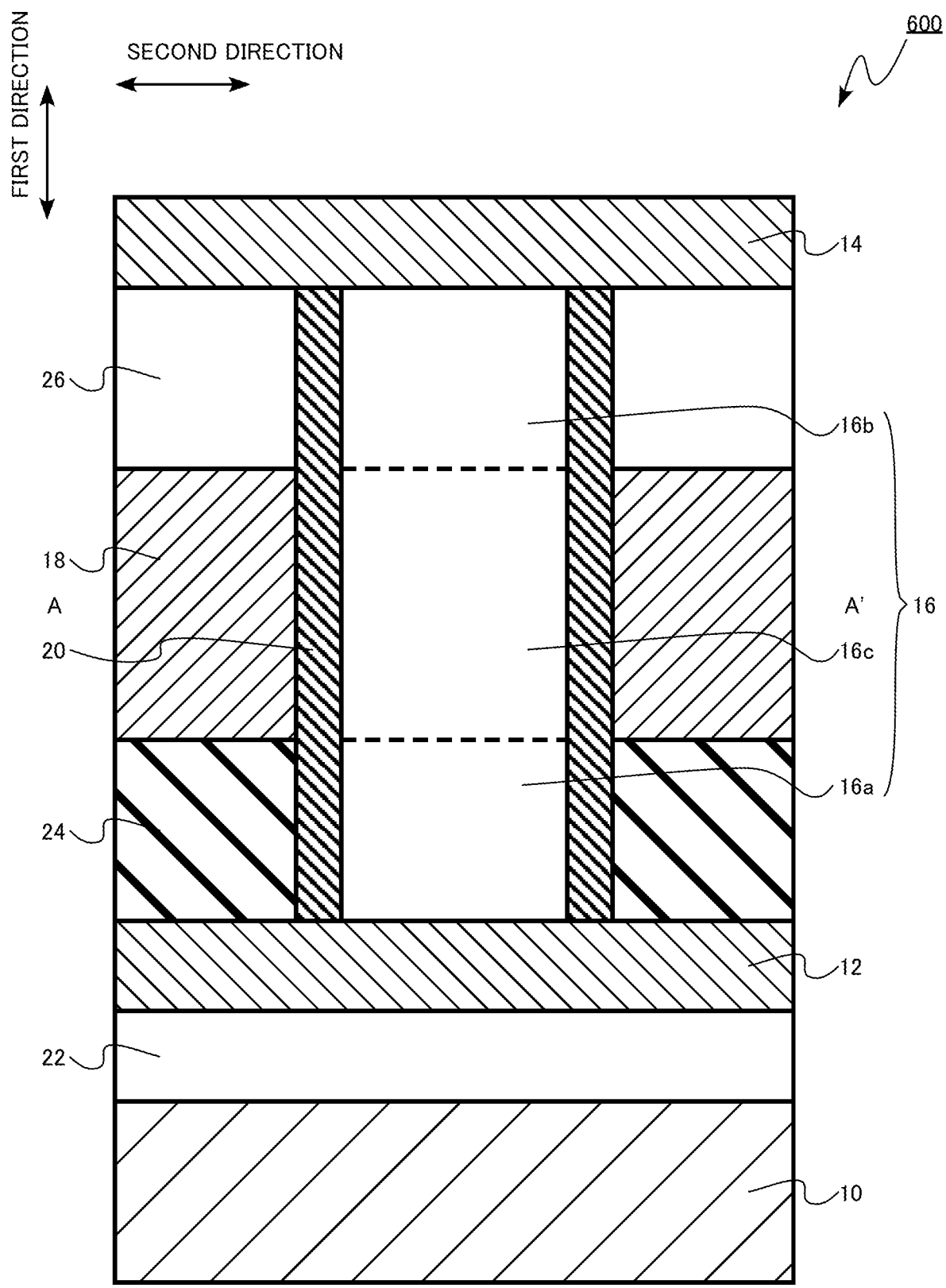
FIG. 14 is a schematic cross-sectional view of a semiconductor device according to a sixth embodiment.

FIG. 14 is a schematic cross-sectional view of the semiconductor device according to the sixth embodiment.

The semiconductor device of the sixth embodiment is a transistor 600. The transistor 600 is an oxide semiconductor transistor in which a channel is formed in an oxide semiconductor layer.

The transistor 600 includes a silicon substrate 10, a lower electrode 12, an upper electrode 14, an oxide semiconductor layer 16, a gate electrode 18, a gate insulating layer 20, a substrate insulating layer 22, a lower insulating layer 24, and an upper insulating layer 26. The oxide semiconductor layer 16 includes a lower region 16a, an upper region 16b, and an intermediate region 16c.

The silicon substrate 10 is an example of a substrate. The lower electrode 12 is an example of a second electrode. The upper electrode 14 is an example of a first electrode. The lower insulating layer 24 is an example of a second insulating layer. The upper insulating layer 26 is an example of a first insulating layer.

The lower insulating layer 24 is provided on the lower electrode 12. The lower insulating layer 24 is provided between the gate electrode 18 and the lower electrode 12.

The lower insulating layer 24 surrounds the lower region 16a of the oxide semiconductor layer 16. The lower insulating layer 24 surrounds the gate insulating layer 20. The gate insulating layer 20 is provided between the lower insulating layer 24 and the lower region 16a.

An oxygen atom concentration of the lower insulating layer 24 is lower than an oxygen atom concentration of the upper insulating layer 26. The oxygen atom concentration of the lower insulating layer 24 is, for example, equal to or less than half of the oxygen atom concentration of the upper insulating layer 26.

The lower insulating layer 24 is formed of, for example, an oxide, a nitride, or an oxynitride. The lower insulating layer 24 contains, for example, silicon oxide, silicon nitride, or silicon oxynitride. The lower insulating layer 24 contains, for example, a silicon oxide layer, a silicon oxynitride layer, or a silicon nitride layer. The lower insulating layer 24 is, for example, the silicon oxide layer, the silicon oxynitride layer, or the silicon nitride layer.

The upper insulating layer 26 is provided on the gate electrode 18. The upper insulating layer 26 is provided between the gate electrode 18 and the upper electrode 14.

The upper insulating layer 26 surrounds the upper region 16b of the oxide semiconductor layer 16. The upper insulating layer 26 surrounds the gate insulating layer 20. The gate insulating layer 20 is provided between the upper insulating layer 26 and the upper region 16b.

The upper insulating layer 26 is formed of, for example, an oxide or an oxynitride. The upper insulating layer 26 contains, for example, silicon oxide or silicon oxynitride. The upper insulating layer 26 contains, for example, a silicon oxide layer or a silicon oxynitride layer. The upper insulating layer 26 is, for example, the silicon oxide layer or the silicon oxynitride layer.

For example, in a case where the upper insulating layer 26 is the silicon oxide layer, the lower insulating layer 24 is the silicon nitride layer. For example, in a case where the upper insulating layer 26 is the silicon oxide layer, the lower insulating layer 24 is the silicon oxynitride layer.

For example, in a case where the upper insulating layer 26 is the silicon oxide layer, the lower insulating layer 24 is the silicon oxide layer having an oxygen concentration relatively lower than that of the upper insulating layer 26. For example, in a case where the upper insulating layer 26 is the silicon oxide layer whose atomic ratio (Si/O) of silicon (Si) to oxygen (O) is ½, the lower insulating layer 24 is the silicon oxide layer whose atomic ratio (Si/O) of silicon (Si) to oxygen (O) is higher than ½.

For example, a material of the lower electrode 12 may be different from a material of the upper electrode 14. For example, the material of the lower electrode 12 may be less likely to absorb oxygen of the oxide semiconductor layer 16 than the material of the upper electrode 14. In a case where the material of the lower electrode 12 hardly absorbs the oxygen of the oxide semiconductor layer 16, the oxygen vacancy concentration of the lower region 16a may decrease after the heat treatment. As the oxygen vacancy concentration of the lower region 16a decreases, a contact resistance between the lower region 16a and the lower electrode 12 increases. Therefore, the asymmetry of the on-state current of the transistor may occur.

In the transistor 600, an oxygen atom concentration of the lower insulating layer 24 is lower than an oxygen atom concentration of the upper insulating layer 26. Therefore, when the heat treatment is performed, an amount of the oxygen supplied from the lower insulating layer 24 to the lower region 16a is smaller than an amount of the oxygen supplied from the upper insulating layer 26 to the upper region 16b. Therefore, a decrease in the oxygen vacancy concentration of the lower region 16a is suppressed. Accordingly, a decrease in a carrier concentration of the lower region 16a is suppressed, and an increase in a contact resistance between the lower region 16a and the lower electrode 12 is suppressed. Therefore, the development of asymmetry of the on-state current of the transistor 600 after the heat treatment is suppressed.

According to the sixth embodiment, the asymmetry of the on-state current after the heat treatment is suppressed, and the oxide semiconductor transistor having a stable characteristic is realized.

Seventh Embodiment

A semiconductor device according to the seventh embodiment is different from the semiconductor device according to the sixth embodiment in that, in a cross section of an oxide semiconductor layer parallel to a first direction, a first width in a second direction perpendicular to the first direction at a first position in the oxide semiconductor layer is greater than a second width in the second direction at a second position closer to a second electrode than the first position in the oxide semiconductor layer. Hereinafter, descriptions overlapping with those in the sixth embodiment may be partially omitted.

Figure 15:
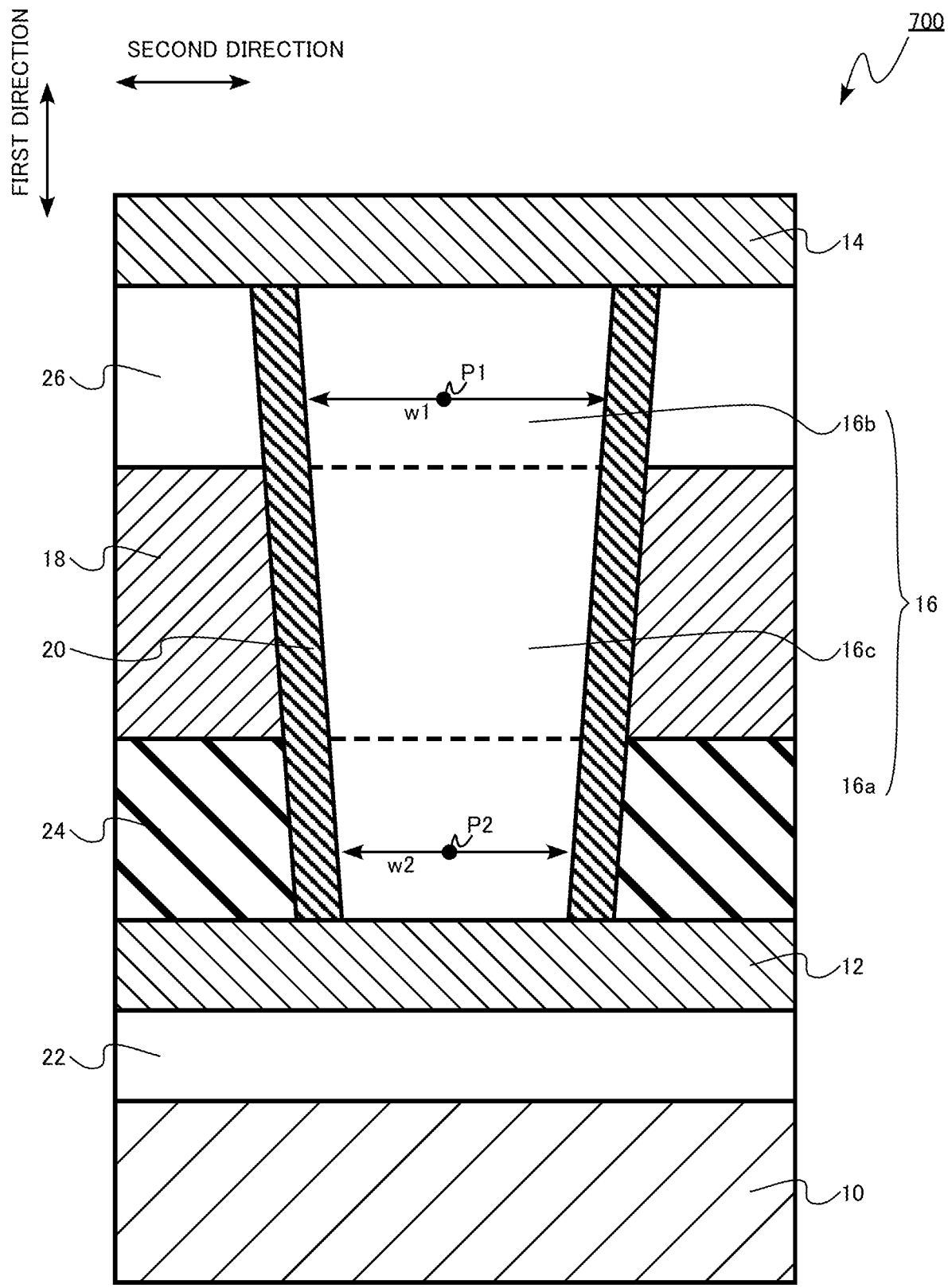
FIG. 15 is a schematic cross-sectional view of a semiconductor device according to a seventh embodiment.

FIG. 15 is a schematic cross-sectional view of the semiconductor device according to the seventh embodiment.

The semiconductor device of the seventh embodiment is a transistor 700. The transistor 700 is an oxide semiconductor transistor in which a channel is formed in an oxide semiconductor layer.

The transistor 700 includes a silicon substrate 10, a lower electrode 12, an upper electrode 14, an oxide semiconductor layer 16, a gate electrode 18, a gate insulating layer 20, a substrate insulating layer 22, a lower insulating layer 24, and an upper insulating layer 26. The oxide semiconductor layer 16 includes a lower region 16a, an upper region 16b, and an intermediate region 16c.

The silicon substrate 10 is an example of a substrate. The lower electrode 12 is an example of a second electrode. The upper electrode 14 is an example of a first electrode. The lower insulating layer 24 is an example of a second insulating layer. The upper insulating layer 26 is an example of a first insulating layer.

An oxygen atom concentration of the lower insulating layer 24 is lower than an oxygen atom concentration of the upper insulating layer 26. The oxygen atom concentration of the lower insulating layer 24 is, for example, equal to or less than half of the oxygen atom concentration of the upper insulating layer 26.

In a cross section of the oxide semiconductor layer 16 parallel to a first direction, a first width (w1 in FIG. 15) of the oxide semiconductor layer 16 in a second direction perpendicular to the first direction at a first position (P1 in FIG. 15) in the oxide semiconductor layer 16 is greater than a second width (w2 in FIG. 15) of the oxide semiconductor layer 16 in the second direction at a second position (P2 in FIG. 15) closer to the lower electrode 12 than the first position P1 in the oxide semiconductor layer 16.

For example, the width of the oxide semiconductor layer 16 in the second direction decreases as being directed from the upper electrode 14 toward the lower electrode 12. A side face of the oxide semiconductor layer 16 has a tapered shape.

According to the seventh embodiment, the asymmetry of the on-state current after the heat treatment is suppressed by the same function as that in the sixth embodiment, and the oxide semiconductor transistor having a stable characteristic is realized.

Eighth Embodiment

A semiconductor memory device according to the eighth embodiment includes a first electrode, a second electrode, an oxide semiconductor layer provided between the first electrode and the second electrode, a gate electrode provided between the first electrode and the second electrode in a first direction from the first electrode toward the second electrode and opposed to the oxide semiconductor layer, a gate insulating layer provided between the oxide semiconductor layer and the gate electrode, a first insulating layer provided between the gate electrode and the first electrode, a second insulating layer provided between the gate electrode and the second electrode and having an oxygen atom concentration lower than an oxygen atom concentration of the first insulating layer, and a capacitor electrically connected to the first electrode or the second electrode.

The semiconductor memory device of the eighth embodiment is a semiconductor memory 800. The semiconductor memory device of the eighth embodiment is a DRAM. The semiconductor memory 800 uses the transistor 100 of the first embodiment as a switching transistor of a memory cell of the DRAM.

Hereinafter, descriptions overlapping with those in the first embodiment may be partially omitted.

Figure 16:
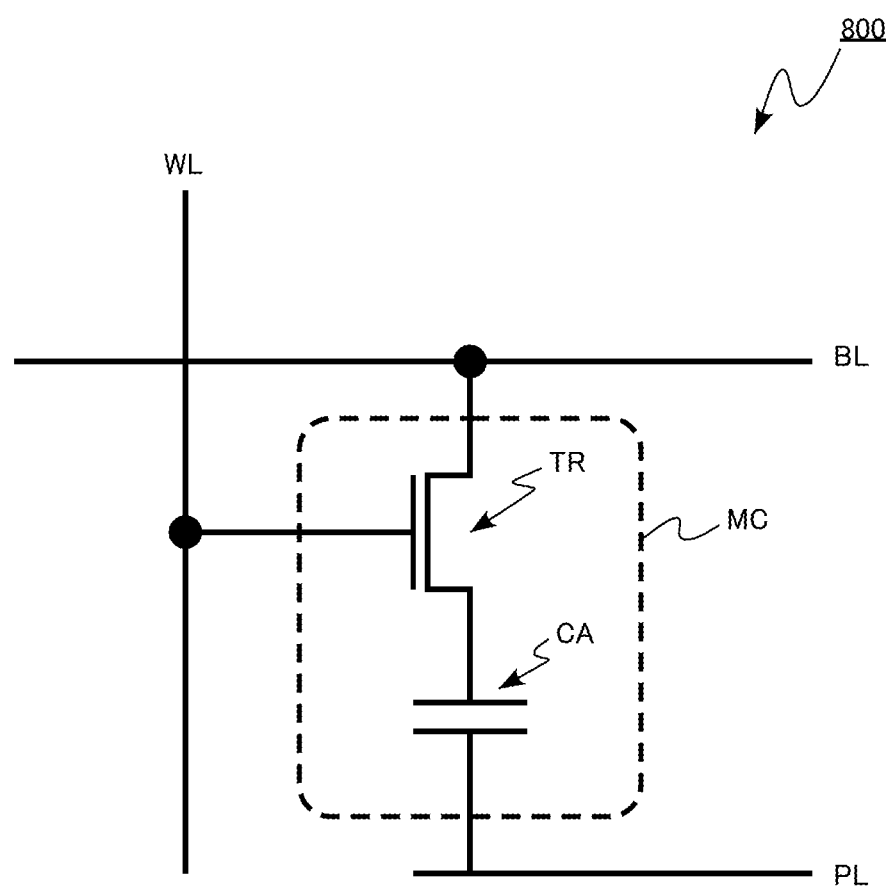
FIG. 16 is an equivalent circuit diagram of a semiconductor memory device according to an eighth embodiment.

FIG. 16 is an equivalent circuit diagram of the semiconductor memory device according to the eighth embodiment. FIG. 16 illustrates a case where there is one memory cell MC, but a plurality of the memory cells MC may be provided, for example, in an array.

The semiconductor memory 800 includes the memory cell MC, a word line WL, a bit line BL, and a plate line PL. The memory cell MC includes a switching transistor TR and a capacitor CA. In FIG. 16, a region surrounded by a broken line is the memory cell MC.

The word line WL is electrically connected to the gate electrode of the switching transistor TR. The bit line BL is electrically connected to one of a source and drain electrodes of the switching transistor TR. One electrode of the capacitor CA is electrically connected to the other of the source and drain electrodes of the switching transistor TR. The other electrode of the capacitor CA is connected to the plate line PL.

The memory cell MC stores data by accumulating electric charges in the capacitor CA. The data is written and read by turning on the switching transistor TR.

For example, the switching transistor TR is turned on in a state in which a desired voltage is applied to the bit line BL, and the data is written to the memory cell MC.

For example, the switching transistor TR is turned on, a voltage variation of the bit line BL corresponding to an amount of the electric charges accumulated in the capacitor is detected, and the data of the memory cell MC is read.

Figure 17:
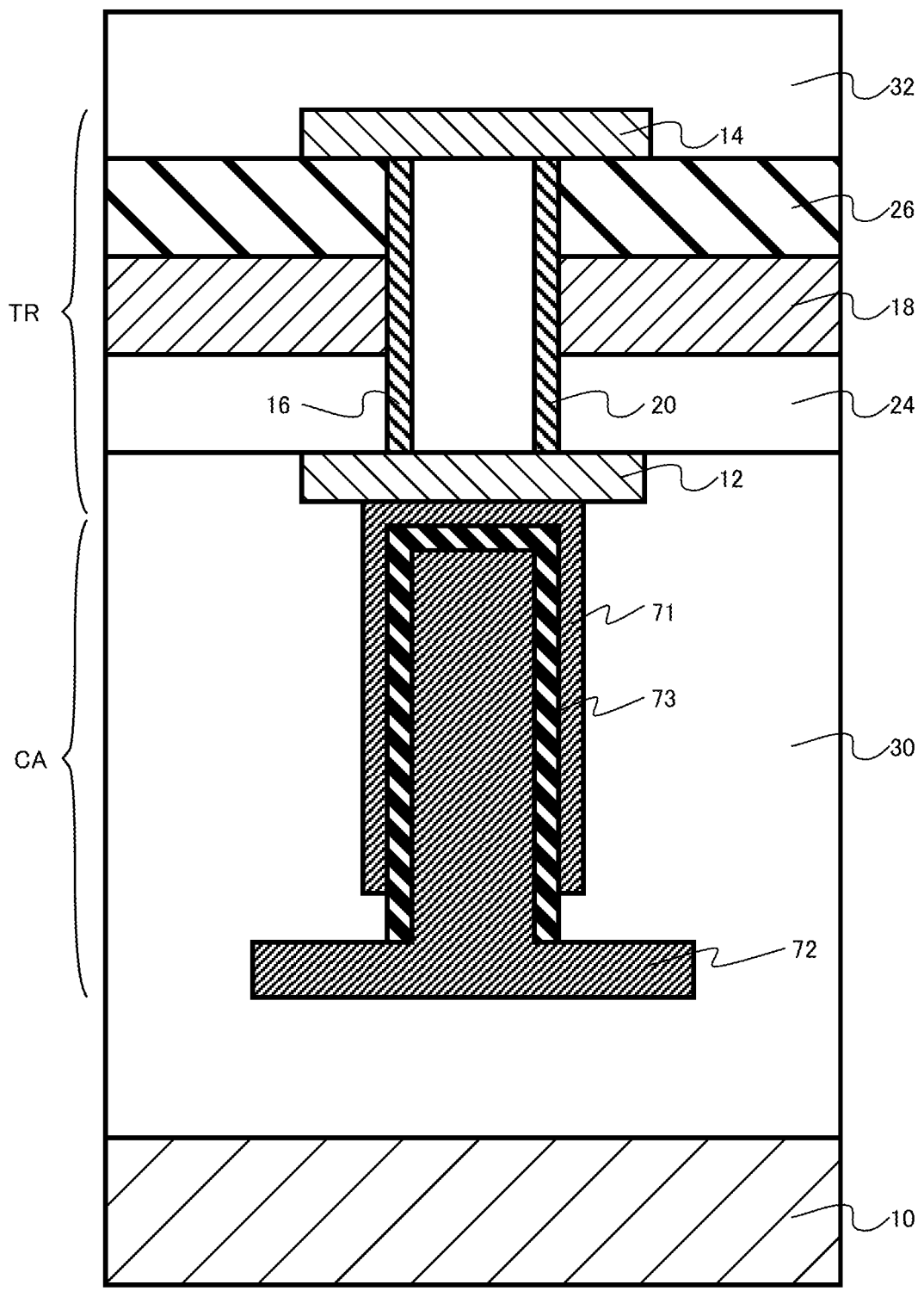
FIG. 17 is a schematic cross-sectional view of the semiconductor memory device according to the eighth embodiment.

FIG. 17 is a schematic cross-sectional view of the semiconductor memory device according to the eighth embodiment. FIG. 17 illustrates a cross section of the memory cell MC of the semiconductor memory 800.

The semiconductor memory 800 includes a silicon substrate 10, a switching transistor TR, a capacitor CA, a lower interlayer insulating layer 30, and an upper interlayer insulating layer 32. The silicon substrate 10 is an example of a substrate.

The switching transistor TR includes a lower electrode 12, an upper electrode 14, an oxide semiconductor layer 16, a gate electrode 18, a gate insulating layer 20, a lower insulating layer 24, and an upper insulating layer 26. The lower electrode 12 is an example of a first electrode. The upper electrode 14 is an example of a second electrode. The lower insulating layer 24 is an example of a first insulating layer. The upper insulating layer 26 is an example of a second insulating layer.

The switching transistor TR has the same structure as that of the transistor 100 of the first embodiment.

The capacitor CA is provided between the silicon substrate 10 and the switching transistor TR. The capacitor CA is provided between the silicon substrate 10 and the lower electrode 12. The capacitor CA is electrically connected to the lower electrode 12.

The capacitor CA includes a cell electrode 71, a plate electrode 72, and a capacitor insulating film 73. The cell electrode 71 is electrically connected to the lower electrode 12. For example, the cell electrode 71 is in contact with the lower electrode 12.

The cell electrode 71 and the plate electrode 72 are formed of, for example, titanium nitride. The capacitor insulating film 73 has, for example, a stacked structure of zirconium oxide, aluminum oxide, and zirconium oxide.

The gate electrode 18 is electrically connected to, for example, the word line WL (not illustrated). The upper electrode 14 is electrically connected to, for example, the bit line BL (not illustrated). The plate electrode 72 is connected to the plate line PL (not illustrated).

When the semiconductor memory 800 is manufactured, the switching transistor TR is formed after the capacitor CA is formed on the silicon substrate 10. When the switching transistor TR is formed, the oxide semiconductor layer 16 and the upper electrode 14 are formed in this order after the lower electrode 12 is formed.

In the semiconductor memory 800, an oxide semiconductor transistor having an extremely small channel leakage current during an off operation is applied to the switching transistor TR. Therefore, a DRAM having an excellent electric charge holding characteristic is realized.

In the switching transistor TR of the semiconductor memory 800, development of asymmetry of the on-state current caused by performing the heat treatment is suppressed. Therefore, the characteristic of the switching transistor TR is stabilized, and the characteristic of the semiconductor memory 800 is also stabilized.

In the first to seventh embodiments, an example of the transistor in which the gate electrode is provided so as to surround the oxide semiconductor layer has been described, but the transistor according to the embodiment of the present disclosure may be a transistor in which the gate electrode does not surround the oxide semiconductor layer. For example, the transistor according to the embodiment of the present disclosure may be a transistor in which the oxide semiconductor layer is interposed between two gate electrodes.

In the eighth embodiment, the semiconductor memory to which the transistor of the first embodiment is applied has been described as an example, but the semiconductor memory according to the embodiment of the present disclosure may be a semiconductor memory to which the transistors of the second to seventh embodiments are applied.

In the eighth embodiment, the semiconductor memory in which the cell electrode is electrically connected to the lower electrode has been described as an example, but the semiconductor memory according to the embodiment of the present disclosure may be a semiconductor memory in which the cell electrode is electrically connected to the upper electrode.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising: a first electrode; a second electrode; an oxide semiconductor layer provided between the first electrode and the second electrode; a gate electrode opposed to the oxide semiconductor layer; a gate insulating layer provided between the oxide semiconductor layer and the gate electrode; a first insulating layer provided between the gate electrode and the first electrode; and a second insulating layer provided between the gate electrode and the second electrode, and the second insulating layer having an oxygen atom concentration lower than an oxygen atom concentration of the first insulating layer, and further comprising a substrate, the first electrode provided between the substrate and the second electrode.

2. The semiconductor device according to claim 1, wherein the gate electrode surrounds the oxide semiconductor layer.

3. The semiconductor device according to claim 1, wherein the second insulating layer includes a silicon nitride layer or a silicon oxide layer, atomic ratio (Si/O) of silicon (Si) to oxygen (O) in the silicon oxide layer is higher than 1/2.

4. The semiconductor device according to claim 1, wherein the oxygen atom concentration of the second insulating layer is equal to or less than half the oxygen atom concentration of the first insulating layer.

5. The semiconductor device according to claim 1, wherein the second insulating layer includes a first region and a second region, the second region is provided between the first region and the second electrode, and the second region has an oxygen atom concentration lower than an oxygen atom concentration of the first region.

6. The semiconductor device according to claim 1, wherein a thickness of the gate insulating layer between the second insulating layer and the oxide semiconductor layer in a second direction perpendicular to a first direction from the first electrode toward the second electrode is smaller than a thickness of the gate insulating layer between the first insulating layer and the oxide semiconductor layer in the second direction.

7. The semiconductor device according to claim 1, wherein the second insulating layer is in contact with the oxide semiconductor layer.

8. The semiconductor device according to claim 1, further comprising a third insulating layer surrounded by the second insulating layer, the third insulating layer surrounded by the oxide semiconductor layer, and the third insulating layer having an oxygen atom concentration lower than the oxygen atom concentration of the first insulating layer.

9. The semiconductor device according to claim 1, wherein in a cross section of the oxide semiconductor layer parallel to a first direction from the first electrode toward the second electrode, a first width of the oxide semiconductor layer in a second direction perpendicular to the first direction at a first position in the oxide semiconductor layer is smaller than a second width of the oxide semiconductor layer in the second direction at a second position in the oxide semiconductor layer, and the second position is closer to the second electrode than the first position.

10. The semiconductor device according to claim 1, further comprising a substrate, the second electrode provided between the substrate and the first electrode.

11. The semiconductor device according to claim 10, wherein in a cross section of the oxide semiconductor layer parallel to a first direction from the first electrode toward the second electrode, a first width of the oxide semiconductor layer in a second direction perpendicular to the first direction at a first position in the oxide semiconductor layer is greater than a second width of the oxide semiconductor layer in the second direction at a second position in the oxide semiconductor layer, and the second position is closer to the second electrode than the first position.

12. A semiconductor memory device comprising: a first electrode; a second electrode; an oxide semiconductor layer provided between the first electrode and the second electrode; a gate electrode opposed to the oxide semiconductor layer; a gate insulating layer provided between the oxide semiconductor layer and the gate electrode; a first insulating layer provided between the gate electrode and the first electrode; a second insulating layer provided between the gate electrode and the second electrode, and the second insulating layer having an oxygen atom concentration lower than an oxygen atom concentration of the first insulating layer; and a capacitor electrically connected to the first electrode or the second electrode, and further comprising a substrate, wherein the capacitor is provided between the substrate and the first electrode.

13. The semiconductor memory device according to claim 12, wherein the gate electrode surrounds the oxide semiconductor layer.

14. The semiconductor memory device according to claim 12, wherein the second insulating layer includes a silicon nitride layer or a silicon oxide layer, an atomic ratio (Si/O) of silicon (Si) to oxygen (O) in the silicon oxide layer is higher than 1/2.

15. The semiconductor memory device according to claim 12, wherein the oxygen atom concentration of the second insulating layer is equal to or less than half the oxygen atom concentration of the first insulating layer.

* * * * *